(12) United States Patent
Koshimizu et al.

(10) Patent No.: US 12,142,679 B2
(45) Date of Patent: Nov. 12, 2024

(54) SEMICONDUCTOR DEVICE

(71) Applicant: RENESAS ELECTRONICS CORPORATION, Tokyo (JP)

(72) Inventors: Makoto Koshimizu, Tokyo (JP); Yasutaka Nakashiba, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 270 days.

(21) Appl. No.: 17/722,778

(22) Filed: Apr. 18, 2022

(65) Prior Publication Data

US 2022/0393027 A1  Dec. 8, 2022

(30) Foreign Application Priority Data

Jun. 4, 2021 (JP) .................... 2021-094457

(51) Int. Cl.
*H01L 29/78* (2006.01)
*H01L 29/08* (2006.01)
*H01L 29/66* (2006.01)

(52) U.S. Cl.
CPC ........ *H01L 29/7824* (2013.01); *H01L 29/086* (2013.01); *H01L 29/0878* (2013.01); *H01L 29/66681* (2013.01)

(58) Field of Classification Search
CPC ............... H01L 29/7824; H01L 29/086; H01L 29/0878; H01L 29/66681; H01L 29/66659; H01L 29/42368; H01L 29/402; H01L 29/7835; H01L 29/7818; H01L 29/7816
See application file for complete search history.

(56) References Cited

U.S. PATENT DOCUMENTS

| | | | |
|---|---|---|---|
| 2015/0155358 A1* | 6/2015 | Briere ............. | H01L 29/405 257/194 |
| 2016/0005858 A1* | 1/2016 | Ma ............. | H01L 29/402 257/493 |
| 2016/0240669 A1 | 8/2016 | Wei | |
| 2020/0335623 A1* | 10/2020 | Shin ............. | H01L 29/7816 |
| 2021/0193805 A1* | 6/2021 | Yoo ............. | H01L 29/404 |

FOREIGN PATENT DOCUMENTS

| | | |
|---|---|---|
| JP | 2001-7327 A | 1/2001 |
| JP | 2003-197909 A | 7/2003 |

OTHER PUBLICATIONS

J. Wei, X. Luo, X. Shi, R. Tian, B. Zhang and Z. Li, "An improved on-resistance high voltage LDMOS with junction field plate," 2014 IEEE 26th International Symposium on Power Semiconductor Devices & IC's (ISPSD), 2014, pp. 127-130.

(Continued)

*Primary Examiner* — Mohammed R Alam
(74) *Attorney, Agent, or Firm* — Rimon P.C.

(57) ABSTRACT

In semiconductor device, a field plate portion having a high concentration p-type semiconductor region, a low concentration p-type semiconductor region having a lower impurity concentration than the high concentration p-type semiconductor region and a high concentration n-type semiconductor region is provided. Then, the high concentration p-type semiconductor region is electrically connected to the source region while the high concentration n-type semiconductor region is electrically connected to the drain region.

13 Claims, 26 Drawing Sheets

(56) References Cited

OTHER PUBLICATIONS

Extended European Search Report issued in corresponding European Patent Application No. 22176921.9-1212, dated Oct. 21, 2022.
Tomoyuki Miyoshi, Tohoku University Research Paper, "A Study on Higher Performance Lateral-Diffused-MOSFET for High-Voltage Integrated Circuits", Tohoku University Institutional Repository, Bachelor's Degree Conferral Number 11301 Ko No. 16629, Mar. 30, 2016.
Office Action dated Jun. 25, 2024 from corresponding JP Application No. 2021-094457, 10 pages.

* cited by examiner

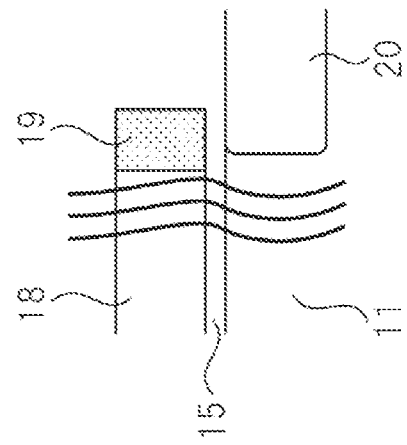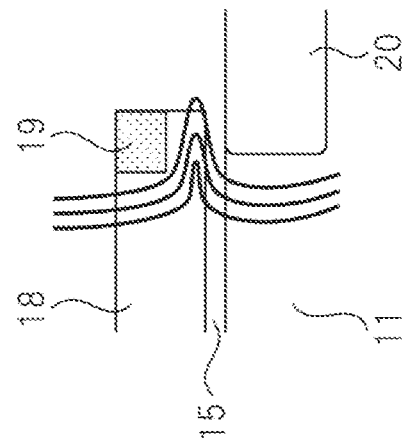

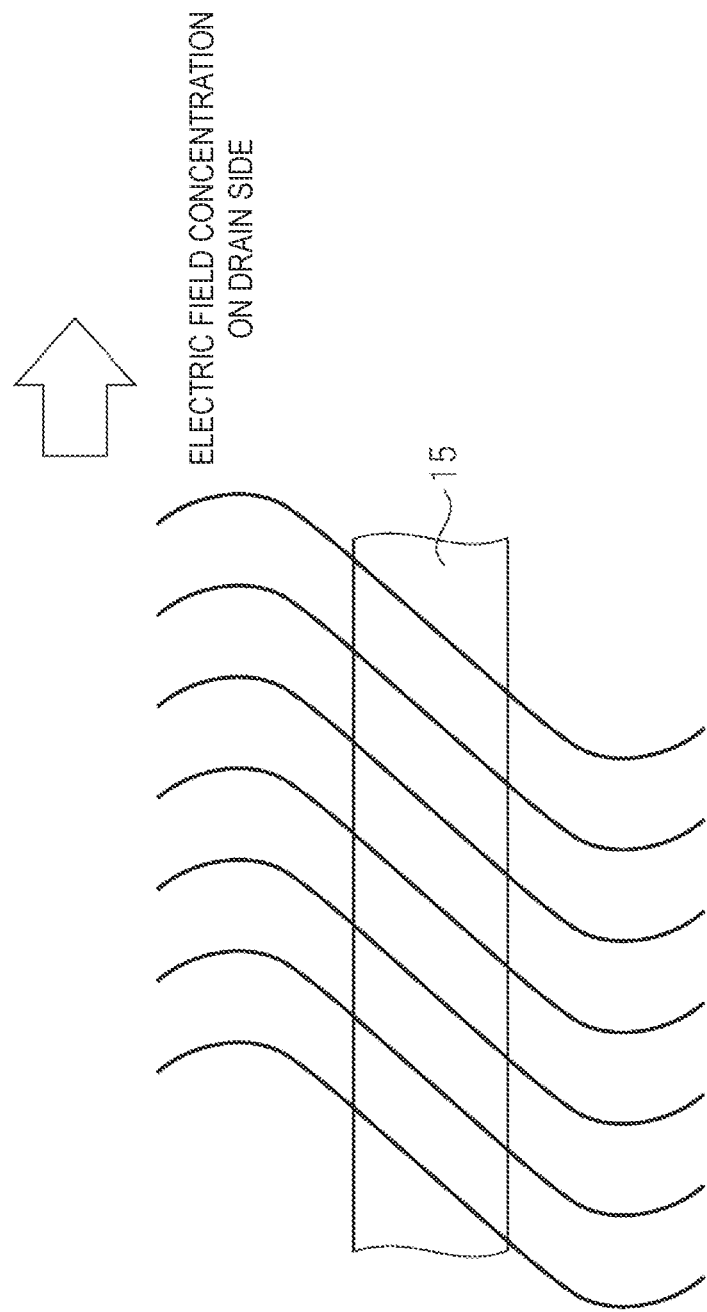

SEMICONDUCTOR DEVICE

CROSS-REFERENCE TO RELATED APPLICATIONS

The disclosure of Japanese Patent Application No. 2021-094457 filed on Jun. 4, 2021, including the specification, drawings and abstract is incorporated herein by reference in its entirety.

BACKGROUND

The present invention relates to a semiconductor device and, for example, to techniques valid for application to semiconductor device including laterally diffused MOSFET (LDMOSFET: Lateral Diffused Metal Oxide Semiconductor Field Effect Transistor).

There are disclosed techniques listed below.

[Non-Patent Document 1] Tomoyuki Sanjo, Tohoku University's research paper "A Study on Higher Performance Lateral-Diffused-MOSFET for High-Voltage Integrated Circuits", Tohoku University Institution Repository, Graduation Number "11301-16629"

Non-Patent Document 1 discloses a study on high performance of LDMOSFET.

SUMMARY

In LDMOSFET, there is a trade-off relation between high breakdown voltage and on-resistance reduction. For example, in order to improve high breakdown voltage of LDMOSFET, the impurity concentration of the drift layer needs to be lowered. However, when the impurity concentration of the drift layer is lowered, the on-resistance increases. Conversely, when the impurity concentration of the drift layer increases in order to reduce the on-resistance, the depletion layer is less likely to extend between the source region and the drain region. Consequently, in the drift layer at the vicinity of the source region, a distance between the equipotential lines becomes narrower and the electric field intensity is increased, and then the breakdown voltage of LDMOSFET is reduced. Therefore, it is desirable to achieve both high breakdown voltage and on-resistance reduction, which are trade-off relation with each other.

In a semiconductor device according to one embodiment, a field plate portion which has a first semiconductor region of a second conductivity type different from a first conductivity type and has a second semiconductor region of the first conductivity type is provided. Also, the first semiconductor region is electrically connected to the source region, and the second semiconductor region is electrically connected to the drain region.

According to one embodiment, the performance of semiconductor device can be improved.

BRIEF DESCRIPTION OF THE DRAWINGS

FIG. 22A is a schematic diagram showing that the equipotential line distribution is dense in a configuration that does not employ the second contrivance point, and FIG. 22B is a schematic diagram showing that the equipotential line distribution is hard to be dense by a configuration employing the second contrivance point.

FIG. 26 is a diagram schematically showing an equipotential line distribution when the insulating film is thick.

DETAILED DESCRIPTION

Figure 1:
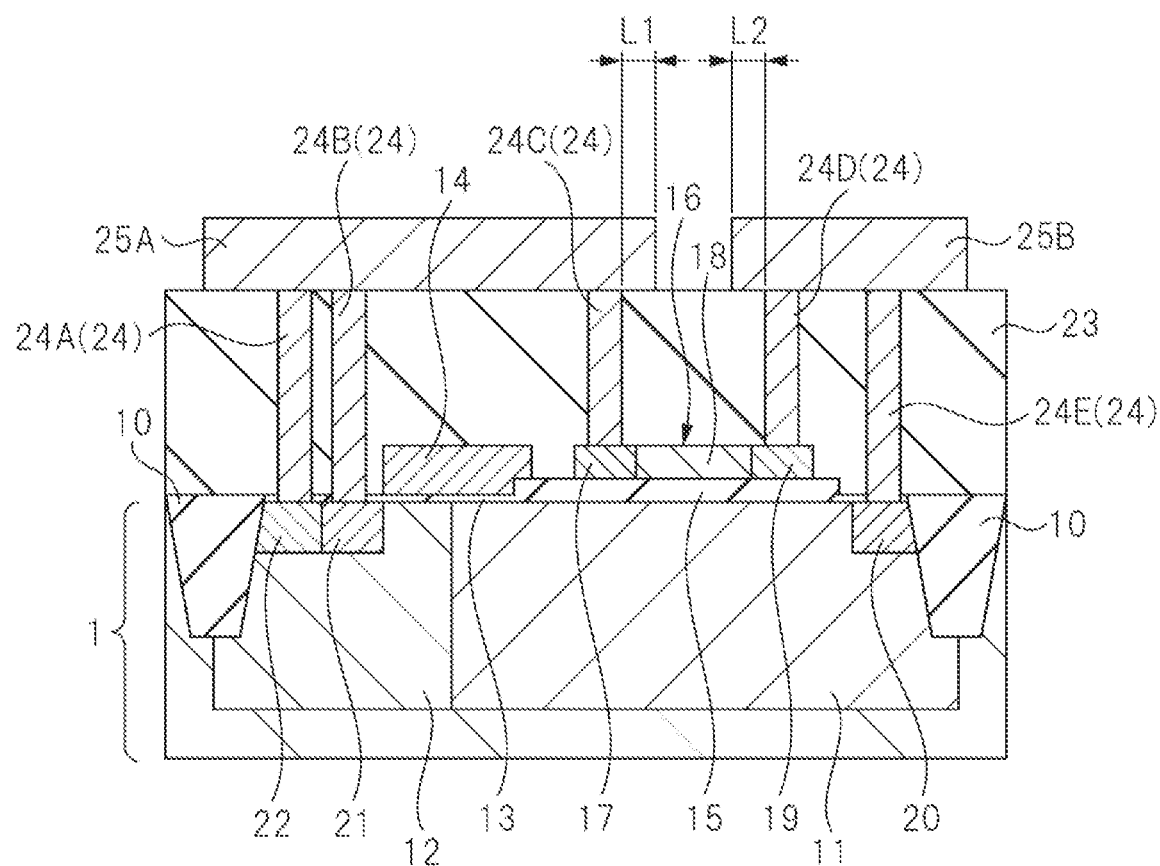
FIG. 1 is a cross-sectional view showing the device structure of semiconductor device according to one embodiment.

In all the drawings for explaining the embodiments, the same members are denoted by the same reference numerals in principle, and repetitive descriptions thereof are omitted. Note that even plan view may be hatched for the sake of clarity.

Explanation of Related Art

The related art referred to herein is not a known technique, but is a technique having a problem found by the present inventors and is a technique which is a premise of the present invention.

For example, as a device structure of LDMOSFET, there is a technique of providing a drift layer having a lower concentration than the drain region between the source region and the drain region in order to ensure a breakdown voltage between the source region and the drain region. On the basis of this device structure, there is a technique for ensuring a breakdown voltage by providing a thick LOCOS structure (about 200 nm) on the surface of the drift layer. In this specification, this technique is referred to as a first related art. Further, there is a technique for ensuring the breakdown voltage by STI structure formed by providing a trench in the drift layer and embedding an insulating film in the trench. In this specification, this technique is referred to as a second related art. The idea underlying the first related art and the second related art is the idea of improving the breakdown voltage by relaxing the electric field by the insulating film configuring LOCOS structure or STI structure, and to realize this idea, the film thickness of the insulating film configuring LOCOS structure or STI structure needs to be increased. Therefore, in the first related art and the second related art, the manufacturing cost of LDMOSFET is increased.

However, more importantly, the idea of improving the breakdown voltage by providing the LOCOS structure and the STI structure in the drift layer is insufficient to make the improvement of the breakdown voltage and the reduction of the on-resistance compatible, which are trade-off relation. That is, the present inventors have acquired, as a novel finding, a need to depart from the idea underlying the first related art and the second related art described above in order to improve the performance of LDMOSFET. Thus, in order to make the improvement of the breakdown voltage and the reduction of the on-resistance compatible in a trade-off relation, a novel idea that is completely different from the idea underlying the first related art and the second related art is required. Therefore, as a result of intensive investigation, the present inventors have found that it is possible to make the improvement of the breakdown voltage and the reduction of the on-resistance compatible, which are in a trade-off relation by a novel basic idea, and therefore, this point will be described.

Basic Idea of Embodiment

The basic idea of the present embodiment is not, for example, the idea of relaxing the electric field by a thick insulating film such as the LOCOS structure or the STI structure, but is the idea of not forming a region where the equipotential lines are dense in the drift layer even if the impurity concentration of the drift layer is slightly higher, by utilizing the field plate portion provided above the drift layer. That is, the basic idea in the present embodiment is the idea of utilizing that a uniform equipotential line distribution is formed such that there is no dense region in the field plate portion and that the equipotential line distribution smoothly connected to this uniform equipotential line distribution is induced in the drift layer. As a result, according to the basic idea, even if the impurity concentration of the drift layer is slightly increased, it is possible to suppress the formation of a region in which the equipotential lines are dense in the drift layer, and hence it is possible to ensure the breakdown voltage. In other words, according to the basic idea in the present embodiment, it is possible to achieve both the improvement of the breakdown voltage and the reduction of the on-resistance, which are mutually trade-off relation.

In particular, the basic idea of the present embodiment utilizes a mechanism in which, by forming a depletion layer having a wide width in the field plate portion, a uniform equipotential line distribution without a dense region is formed in the depletion layer in the field plate portion, and an equipotential line distribution smoothly connected to this uniform equipotential distribution is induced in the depletion layer formed in the drift layer.

An important point in this mechanism is the charge balance between the field plate portion and the drift layer. This is because, by appropriately setting the charge balance between the field plate portion and the drift layer, a uniform equipotential line distribution such that there is no dense region is formed in the depletion layer of the field plate portion, the equipotential line distribution smoothly connected to the uniform equipotential distribution can be induced in the depletion layer formed in the drift layer.

Therefore, the basic idea of the present embodiment is the idea of relaxing the electric field by charge balance between the drift layer and the field plate portion provided above the drift layer. That is, the basic idea is the idea that the improvement of breakdown voltage and the on-resistance reduction which are a trade-off relation with each other are made compatible by appropriately setting the charge balance between the drift layer and the field plate portion. Hereinafter, a concrete embodiment in which the basic idea based on such a mechanism is embodied will be described.

Device Structure of LDMOSFET

FIG. 1 is a cross-sectional view showing the device structure of semiconductor device in the present embodiment.

In FIG. 1, an element isolation region 10 is formed in a semiconductor substrate 1, and an LDMOSFET is formed on an active region surrounded by the element isolation region 10. LDMOSFET has a drift layer 11 which is an n-type semiconductor layer formed in the semiconductor substrate 1 and a p-type body region 12 which is a p-type semiconductor region in contact with the drift layer 11.

Then, a gate electrode 14 is formed on the semiconductor substrate 1 via a gate dielectric film 13. A field plate portion 16 is formed on the semiconductor substrate 1 via an insulating film 15. The field plate portion 16 is configured by a semiconductor region, and is configured by a high concentration p-type semiconductor region 17, a low concentration p-type semiconductor region 18 having a lower impurity concentration than the high concentration p-type semiconductor region 17, and a high concentration n-type semiconductor region 19. The low concentration p-type semiconductor region 18 is arranged so as to be sandwiched between the high concentration p-type semiconductor region 17 and the high concentration n-type semiconductor region 19. Therefore, the field plate portion 16 has a pn junction formed on the junction surface between the low concentration p-type semiconductor region 18 and the high concentration n-type semiconductor region 19. Here, the gate electrode 14 is configured by, for example, an n-type polysilicon film which is an n-type semiconductor film, and the impurity concentration of the field plate portion 16 is lower than the impurity concentration of the gate electrode 14. The field plate portion 16 is configured by, for example, an amorphous semiconductor film represented by an amorphous silicon film, and a single crystal semiconductor film represented by a single crystal silicon film.

The film thickness of the insulating film 15 is thicker than the film thickness of the gate dielectric film 13. For example, the film thickness of the insulating film 15 is about twice as much as the film thickness of the gate dielectric film 13. However, the film thickness of the insulating film 15 is not necessarily required to be thicker than the film thickness of the gate dielectric film 13, and for example, the film thickness of the insulating film 15 may be equal to the film thickness of the gate dielectric film 13.

Further, a drain region 20 made of a high concentration n-type semiconductor region is formed in the drift layer 11. On the other hand, in the p-type body region 12, a source region 21 formed of a high concentration n-type semiconductor region and a p-type body contact region 22 formed of a high concentration p-type semiconductor region are formed.

The interlayer insulating film 23 is formed so as to cover the LDMOSFET configured like this, and a plurality of plugs 24 penetrating the interlayer insulating film 23 is formed in the interlayer insulating film 23. The plurality of plugs 24 include a "plug 24A" electrically connected to the p-type body contact region 22, a "plug 24B" electrically connected to the source region 21, a "plug 24C" electrically connected to the high concentration p-type semiconductor region 17 of the field plate portion 16, a "plug 24D" electrically connected to the high concentration n-type semiconductor region 19 of the field plate portion 16, and a "plug 24E" electrically connected to the drain region 20.

Then, as shown in FIG. 1, on the interlayer insulating film 23 in which the plurality of plugs 24 are formed, wiring 25A and wiring 25B are formed. The wiring 25A is connected with "plug 24A", "plug 24B" and "plug 24C". On the other hand, the wiring 25B is electrically connected to the "plug 24D" and the "plug 24E".

Therefore, as shown in FIG. 1, the high concentration p-type semiconductor region 17 of the field plate portion 16 is electrically connected to the source region 21 and the p-type body contact region 22. On the other hand, the high concentration n-type semiconductor region 19 of the field plate portion 16 is electrically connected to the drain region 20.

Here, for example, a ground potential (0 V) is applied to the source region 21 and the p-type body contact region 22. Therefore, "0 V" is applied to the high concentration p-type semiconductor region 17 in the field plate portion 16 and to the low concentration p-type semiconductor region 18 electrically connected to the high concentration p-type semiconductor region 17. In contrast, for example, a positive potential of 80 V or more is applied to the drain region 20. Therefore, "positive potential of 80V or more" is applied to the high concentration n-type semiconductor region 19 in the field plate portion 16.

At this time, if "0 V" (first potential) is supplied to the source region 21 and higher positive potential than "0 V" (second potential) is supplied to the drain region 20, the field plate portion 16 includes a depleted region. More specifically, the low concentration p-type semiconductor region 18 is depleted.

Operation of LDMOSFET

Subsequently, referring to FIG. 1, the operation of LDMOSFET will be described.

First, the on-operation of LDMOSFET will be described. In FIG. 1, for example, in a condition of applying a positive potential 80 V or more to the drain region 20 with applying a "0 V" to the source region 21, a gate voltage above the threshold voltage is applied to the gate electrode 14. As a result, a channel formed of an n-type inversion layer is formed on the surface of the p-type body region 12 located under the gate electrode 14 via the gate dielectric film 13. Thus, electrons flow in the path of the source region 21, channel (n-type inversion layer), drift layer 11 and drain region 20 in this order. In other words, the current flows in the opposite path of the path described above. Then, LDMOSFET turns on.

Next, the off-operation of LDMOSFET will be described. In FIG. 1, in a state where current flows in LDMOSFET, a gate voltage lower than the threshold voltage is applied to the gate electrode 14. As a result, the channel (n-type inversion layer) formed on the surface of the p-type body region 12 disappears. Thus, as a consequence of the path of electrons flowing from the source region 21 to the drain region 20 is blocked, and then LDMOSFET turns off. At this time, since the source region 21, the p-type body contact region 22 and the p-type body region 12 are electrically connected, "0 V" is also applied to the p-type body region 12. On the other hand, since the drift layer 11 is electrically connected to the drain region 20, "positive potential of 80 V or more" is applied to the drift layer 11. This means that a reverse bias is applied to the pn junction formed at the boundary surface of the p-type body region 12 and the drift layer 11. As a result, the depletion layer extends from the pn junction surface to both the p-type body region 12 and the drift layer 11, the breakdown voltage between the source region 21 and the drain region 20 is ensured by the depletion layer.

However, when the impurity concentration of the drift layer 11 is increased in order to reduce the on-resistance, the electric field intensity in the depletion layer is increased by the extension of the depletion layer is suppressed, and then it is difficult to ensure the breakdown voltage. Even so, when the impurity concentration of the drift layer 11 is lowered, the increase of the on-resistance when LDMOSFET is turned on becomes apparent.

In this regard, the present embodiment employs the above-described basic idea in order to achieve both an improvement of breakdown voltage and a reduction of on-resistance in a high-level, which are trade-off relation with each other. Specifically, as shown in FIG. 1, the high concentration p-type semiconductor region 17 in the field plate portion 16 is electrically connected to the source region 21. On the other hand, the high concentration n-type semiconductor region 19 in the field plate portion 16 is electrically connected to the drain region 20. This means that a reverse bias is applied to the pn junction formed at the junction surface between the low concentration p-type semiconductor region 18 and the high concentration n-type semiconductor region 19 in the field plate portion 16. As a result, a depletion layer having a wide width is formed in the low concentration p-type semiconductor region 18. Thus, as explained in the basic idea described above, it is possible to form a uniform equipotential line distribution such that there is no dense region in the depletion layer of the field plate portion, whereby the equipotential line distribution smoothly connected to a uniform equipotential distribution is induced in the depletion layer formed in the drift layer. Therefore, even if the impurity concentration of the drift layer 11 is slightly increased, it is possible to suppress formation of a region in which the equipotential lines are dense in the drift layer 11, and thus it is possible to ensure the breakdown voltage. In other words, when the basic idea in the present embodiment is applied to the device structure of LDMOSFET, it is possible to achieve both an improvement of breakdown voltage and reduction of on-resistance, which are trade off relation with each other.

Planar Layout Configuration

Figure 2:
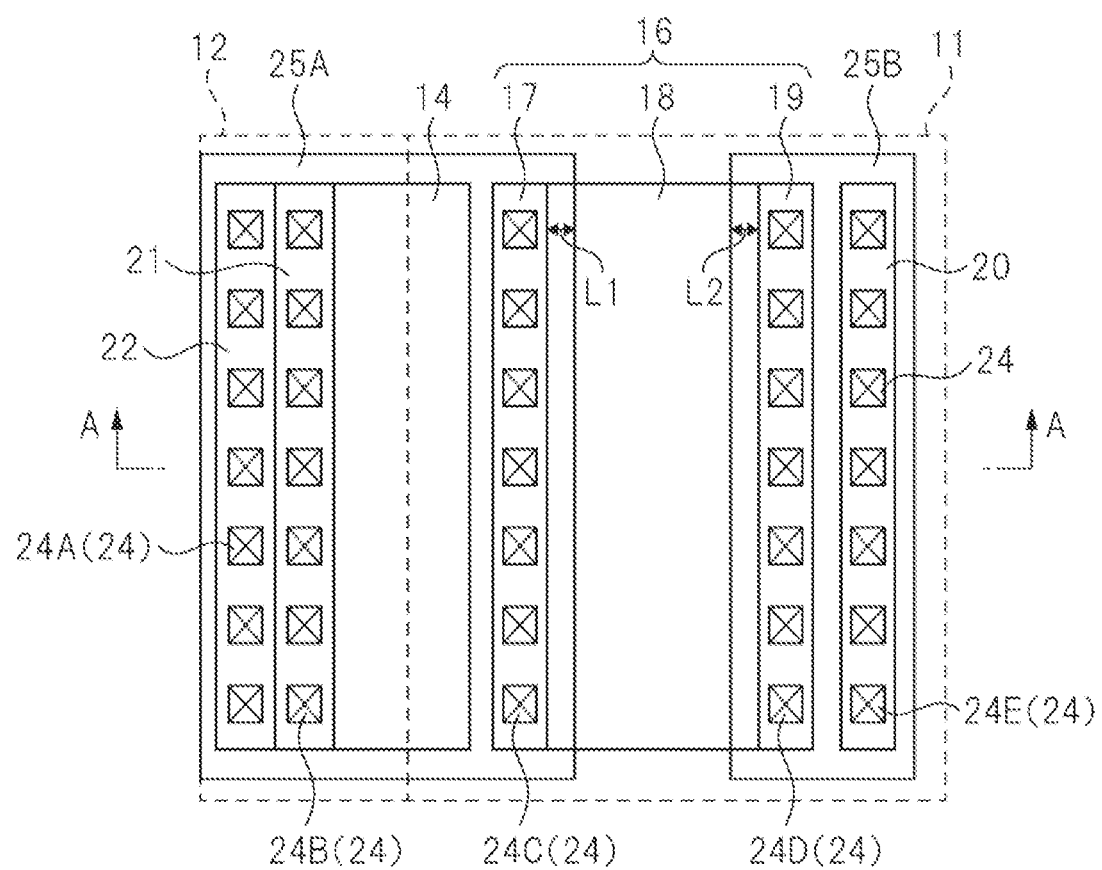
FIG. 2 is a diagram schematically showing a planar layout configuration of semiconductor device.

FIG. 2 is a diagram schematically showing a planar layout configuration of semiconductor device.

Cross-sectional view at line A-A in FIG. 2 corresponds to FIG. 1. In FIG. 2, components denoted by the same reference numerals as in FIG. 1 correspond to components shown in FIG. 1.

As shown in FIG. 2, in plan view, wiring 25A includes a "first overhanging part" overhanged from the "plug 24C" to wiring 25B side. Similarly, in plan view, wiring 25B includes a "second overhanging part" overhanged from the "plug 24D" to wiring 25A side.

Here, the width L1 of the "first overhanging part" shown in FIGS. 1 and 2 is greater than "0". Thus, the electric field at the end portion of the high concentration p-type semiconductor region 17 can be relaxed. Similarly, the width L2 of the "second overhanging part" shown in FIGS. 1 and 2 is also greater than "0". Thus, it is possible to relax the electric field at the end portion of the high concentration n-type semiconductor region 19.

From the viewpoint of achieving electric field relaxation at the end portion of the high concentration p-type semiconductor region 17, it is desirable that the width L1 of the "first overhanging part" is large, and from the viewpoint of achieving electric field relaxation at the end portion of the high concentration n-type semiconductor region 19, it is desirable that the width L2 of the "second overhanging part" is also large. However, if the width L1 and the width L2 is too large, the distance between wiring 25A and wiring 25B is narrowed, the distance between the equipotential lines formed between wiring 25A and wiring 25B is narrowed, and then the breakdown voltage of semiconductor device is reduced. For this reason, for example, it is desirable that the width L1 of the "first overhanging part" and the width L2 of the "second overhanging part" are 0.4 μm or more and 1.0 μm or less, respectively.

Features in the Present Embodiment

Next, the features in the present embodiment will be described.

A feature point in the present embodiment is that, for example, in FIG. 1, in a state in which a potential difference is provided between the source region 21 and the drain region 20, LDMOSFET is configured such that a depletion layer having a wide width is formed in the field plate portion 16 provided above the drift layer 11. Specifically, as shown in FIG. 1, the field plate portion 16 is configured by the high concentration p-type semiconductor region 17, the low concentration p-type semiconductor region 18, and the high concentration n-type semiconductor region 19, and the low concentration p-type semiconductor region 18 is sandwiched between the high concentration p-type semiconductor region 17 and the high concentration n-type semiconductor region 19. Then, the high concentration p-type semiconductor region 17 is electrically connected to the source region 21, and the high concentration n-type semiconductor region 19 is electrically connected to the drain region 20. As a result, a reverse bias is applied to the pn junction formed by the low concentration p-type semiconductor region 18 and the high concentration n-type semiconductor region 19, whereby the low concentration p-type semiconductor region 18 is depleted.

Thus, it is possible to form a uniform equipotential line distribution such that there is no dense region in the depletion layer in the field plate portion 16, and equipotential line distribution smoothly connected to the uniform equipotential distribution is induced in the depletion layer formed in the drift layer 11. Therefore, even if the impurity concentration of the drift layer 11 is slightly increased, it is possible to suppress formation of a region in which the equipotential lines are dense in the drift layer 11, and thus it is possible to ensure the breakdown voltage. That is, according to the feature point in the present embodiment, it is possible to achieve both the improvement of the breakdown voltage and the reduction of the on-resistance, which are trade-off relation with each other.

In particular, in the present embodiment, in FIG. 1, it is important that the direction in which the depletion layer extends in the field plate portion 16 and the direction in which the depletion layer extends in the drift layer 11 are reversed. That is, in the field plate portion 16, the depletion layer extends in a direction toward the inside of the low concentration p-type semiconductor region 18 from the junction surface of the low concentration p-type semiconductor region 18 and the high concentration n-type semiconductor region 19 (left direction in FIG. 1). On the other hand, in the drift layer 11, the depletion layer extends in a direction toward the inside of the drift layer 11 from the junction surface between the drift layer 11 and the p-type body region 12 (right direction in FIG. 1). Thus, the equipotential line in the depletion layer formed in the field plate portion 16 and the equipotential line in the depletion layer formed in the drift layer 11 are easily connected smoothly. That is, by the configuration in which the depletion layer extends in the opposite direction, and by the uniform equipotential line distribution in the depletion layer formed in the field plate portion 16, the uniform equipotential line distribution smoothly connected so that a region where equipotential lines are dense is not formed is likely to be induced in the drift layer 11.

Furthermore, it is important to make the equipotential line distribution in the depletion layer formed in the field plate portion 16 uniform, from this point of view, it is desirable that the field plate portion 16 is an amorphous semiconductor film represented by the amorphous silicon film or a single crystal semiconductor film represented by single crystal silicon film than the polycrystalline semiconductor film represented by the polycrystalline silicon film. Because it is difficult for a polycrystalline semiconductor film to uniformly deplete due to presence of non-uniform size grain boundaries, it is difficult to proceed the depletion uniformly, and it is difficult to produce a uniform equipotential line distribution in the depletion layer.

Figure 3:
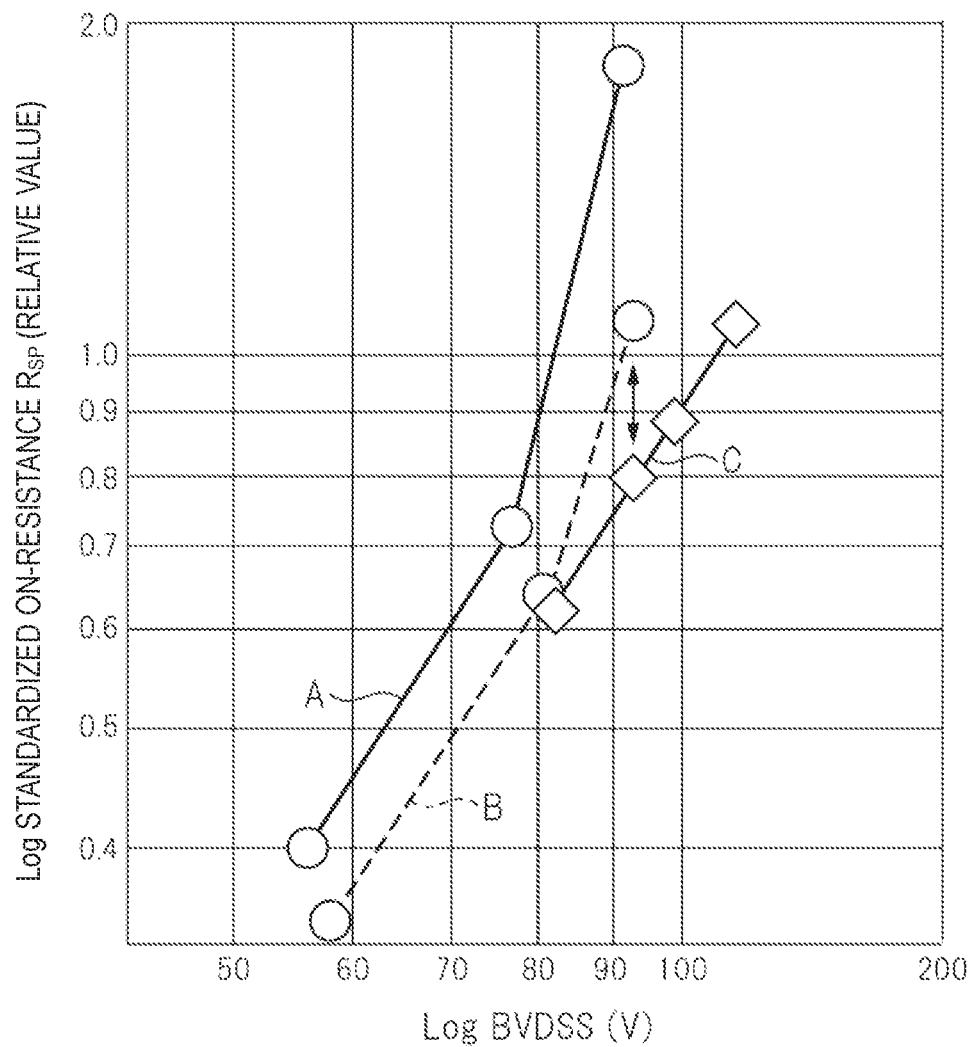
FIG. 3 is a logarithmic graph showing the relationship between the breakdown voltage and the standardized on-resistance.

Next, simulation results supporting the superiority of LDMOSFET in the present embodiment is explained. FIG. 3 is a logarithmic graph showing the relationship between the breakdown voltage (BVDSS) and the standardized on-resistance (relative value). In FIG. 3, "graph A" is a graph representing a first related technique, and "graph B" is a graph representing a second related technique. On the other hand, "graph C" is a graph representing the present embodiment.

For example, a LDMOSFET is used as a transistor that controls the power. In this case, it is important to lower the on-resistance as well as improving the breakdown voltage between the source region and the drain region. In this regard, as shown in FIG. 3, in the first related art and the second related art, it can be seen that it is further difficult to achieve both the improvement of breakdown voltage and the reduction of on-resistance in the breakdown voltage region over 80 V compared to the low breakdown voltage region lower than 80 V.

On the other hand, as shown in FIG. 3, in the present embodiment, it can be seen that remarkable effect of reducing on-resistance while maintaining breakdown voltage can be obtained even in the breakdown voltage region over 90 V. More specifically, according to the present embodiment, the effect of reducing the on-resistance by about 20% can be obtained compared to the second related art while the breakdown voltage of 90 V is obtained. Thus, according to LDMOSFET in the present embodiment, it can be said that it is very excellent in that it is possible to achieve both improvement of breakdown voltage and reduction of on-resistance at a high level.

Further advantages in the present embodiment will be described.

For example, since the first related art and the second related art are techniques for improving the breakdown voltage by relaxing electric field by an insulating film provided under the field plate portion as in LOCOS structure or STI structure, it is required to increase the film thickness of the insulating film. This means that the manufacturing cost of semiconductor device including LDMOSFET is increased.

In contrast, in the present embodiment, based on the uniform equipotential line distribution formed in the depletion layer of the field plate portion 16, it is a technical idea of preventing the dense region from forming in the equipotential line distribution formed in the depletion layer of the drift layer 11. In other words, the technical idea in the present embodiment is the idea of relaxing the electric field by the charge balance of the field plate portion 16 and the drift layer 11. Therefore, in the present embodiment, an extremely thick insulating film is not required, and, for example, an insulating film having a film thickness of about the gate dielectric film 13 may be used. This means that according to LDMOSFET that the technical idea in the present embodiment is embodied, manufacturing costs can be reduced. That is, according to the present embodiment, in addition to advantages from the viewpoint of performance that it is possible to achieve both improvement of breakdown voltage and reduction of on-resistance, advantages from the viewpoint of reducing the manufacturing cost can be obtained.

Furthermore, in the present embodiment, because of easy to deplete by charge balance of the field plate portion 16 and the drift layer 11, even if the drain voltage applied to the drain region 20 is low, it is possible to quickly cause depletion. Therefore, it is possible to reduce the feedback capacitance (Crss) between the gate electrode 14 and the drain region 20. The greater the feedback capacitance, the slower the switching speed, and since the switching loss is also increased, according to LDMOSFET in the present embodiment which can reduce the feedback capacitance, it is also obtained benefits that can reduce risk of power loss and false turn-on.

Method of Manufacturing Semiconductor Device

Next, method of manufacturing a semiconductor device in the present embodiment will be described.

Here, as described above, from the viewpoint of causing uniform equipotential line distribution in the depletion layer formed in the field plate portion 16, the field plate portion 16 is preferably configured by an amorphous semiconductor film or a single crystal semiconductor film than the polycrystalline semiconductor film.

Therefore, as the "first method of manufacturing a semiconductor device", while explaining a method of manufacturing a semiconductor device which the field plate portion 16 is configured by the amorphous silicon film, as the "second method of manufacturing a semiconductor device", a method of manufacturing a semiconductor device which the field plate portion 16 is configured by the single crystal silicon film is explained.

First Method of Manufacturing Semiconductor Device

Figure 4:
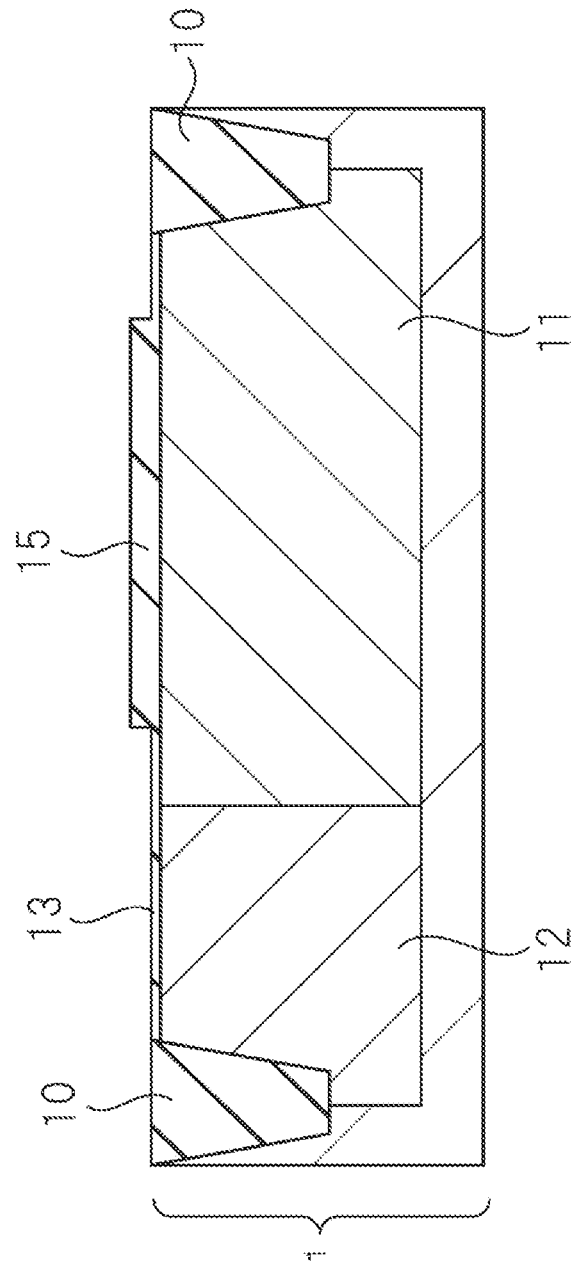
FIG. 4 is a cross-sectional view showing the manufacturing process of semiconductor device in one embodiment.

First, as shown in FIG. 4, after forming the element isolation region 10 in the semiconductor substrate 1, for example, by using a photolithography technique and an ion implantation method, a drift layer 11 and p-type body region 12 are formed in the semiconductor substrate 1. The drift layer 11 is formed by implanting phosphorus, which is an n-type impurity, into the semiconductor substrate 1. On the other hand, the p-type body region 12 is formed by implanting boron, which is a p-type impurity (acceptor), into the semiconductor substrate 1. Thereafter, for example, by using a thermal oxidation method, a gate dielectric film 13 made of a silicon oxide film is formed on a first region of the surface of the semiconductor substrate 1, and an insulating film 15 made of a silicon oxide film is formed on a second region of the surface of the semiconductor substrate 1. The insulating film 15 is formed to have a film thickness greater than that of the gate dielectric film 13, for example.

Figure 5:
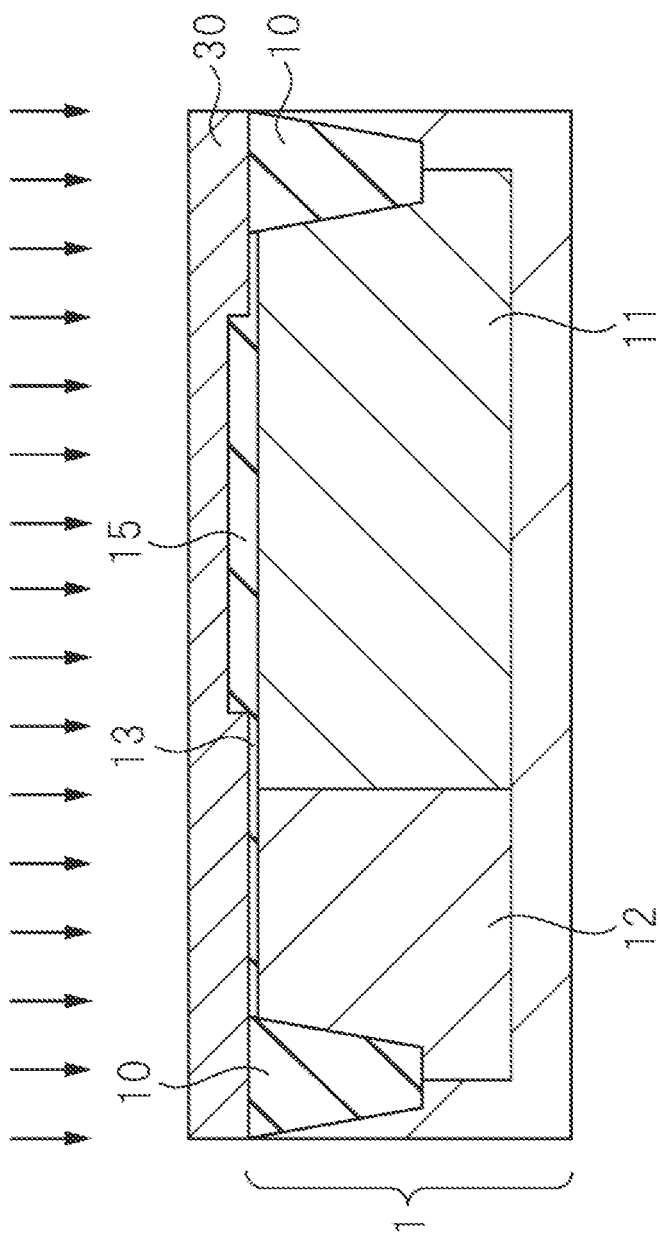
FIG. 5 is a cross-sectional view showing the manufacturing process of semiconductor device following FIG. 4.

Next, as shown in FIG. 5, an amorphous silicon film 30 is formed on the gate dielectric film 13 and the insulating film 15 by using, for example, a CVD (Chemical Vapor Deposition) method. Then, boron, which is a p-type impurity, is implanted into the amorphous silicon film 30 by using an ion implantation method.

Figure 6:
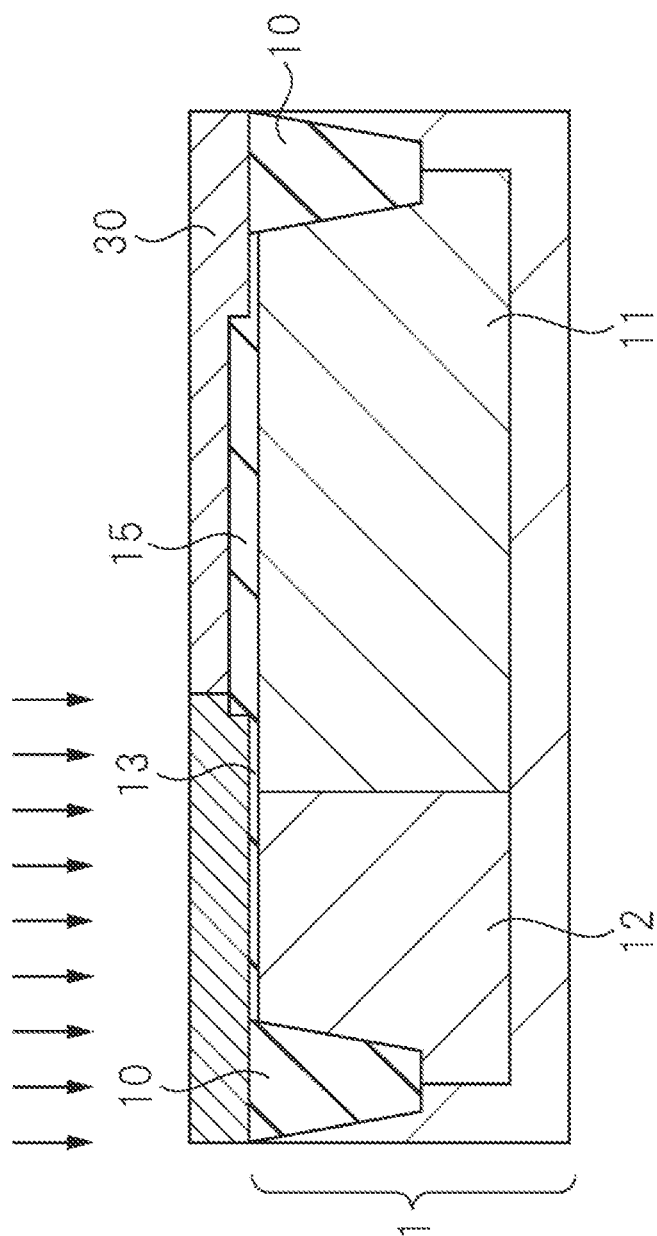
FIG. 6 is a cross-sectional view showing the manufacturing process of semiconductor device following FIG. 5.

Subsequently, as shown in FIG. 6, phosphorus, which is an n-type impurity, is implanted into the amorphous silicon film 30 formed on the first region of the semiconductor substrate 1 by using a photolithography technique and an ion implantation method. At this time, in the region of the amorphous silicon film 30 into which phosphorus as an n-type impurity is implanted, the amorphous silicon film 30 may be formed as polysilicon. In this manner, the amorphous silicon film 30 formed on the first region is formed as an n-type amorphous silicon film or an n-type polysilicon film, while the amorphous silicon film 30 formed on the second region is formed as a p-type amorphous silicon film.

Figure 7:
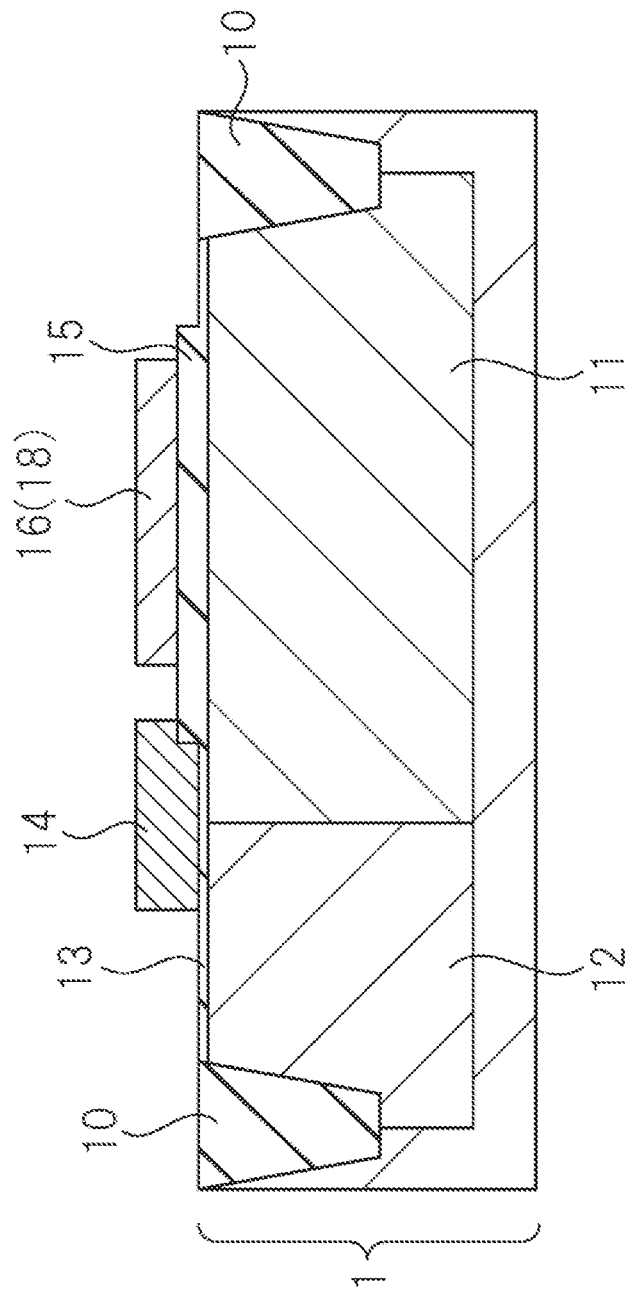
FIG. 7 is a cross-sectional view showing the manufacturing process of semiconductor device following FIG. 6.

Then, the amorphous silicon film 30 is patterned by using a photolithography technique and an etching technique, as shown in FIG. 7. As a result, the gate electrode 14 can be formed on the gate dielectric film 13, and the field plate portion 16 can be formed on the insulating film 15. At this stage, the field plate portion 16 is configured by a low concentration p-type semiconductor region 18.

Figure 8:
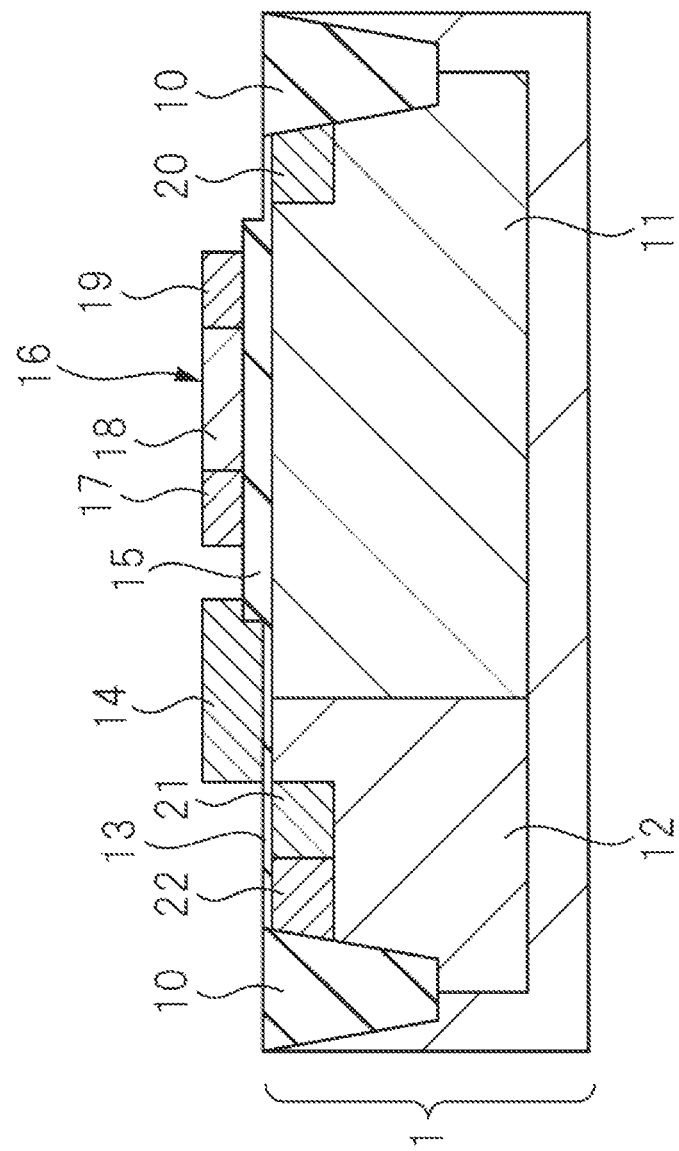
FIG. 8 is a cross-sectional view showing the manufacturing process of semiconductor device following FIG. 7.

Next, as shown in FIG. 8, a high concentration p-type semiconductor region 17 and a high concentration n-type semiconductor region 19 are formed in the field plate portion 16 by using a photolithography technique and an ion implantation method. The high concentration p-type semiconductor region 17 can be formed by implanting boron, which is a p-type impurity, into the field plate portion 16. On the other hand, the high concentration n-type semiconductor region 19 can be formed by implanting phosphorus, which is an n-type impurity, into the field plate portion 16. As a result, the field plate portion 16 is configured by the high concentration p-type semiconductor region 17, the low concentration p-type semiconductor region 18, and the high concentration n-type semiconductor region 19.

Thereafter, the drain region 20 is formed in the drift layer 11, and the source region 21 and the p-type body contact region 22 are formed in the p-type body region 12, by using a photolithography technique and an ion implantation method. The drain region 20 and the source region 21 can be formed by implanting phosphorus which is an n-type impurity. On the other hand, the p-type body contact region 22 can be formed by implanting boron which is a p-type impurity.

After LDMOSFET is formed in this manner, a wiring step is performed. Specifically, as shown in FIG. 1, an interlayer insulating film 23 is formed so as to cover LDMOSFET. Then, by using a photolithography technique and etching technique, after forming a plurality of contact holes in the interlayer insulating film 23, a plurality of plugs 24 are formed by embedding a conductor film in each of the plurality of contact holes. Subsequently, wiring 25A and wiring 25B are formed on the interlayer insulating film 23 in which a plurality of plugs 24 are formed.

Here, as shown in FIG. 1, the high concentration p-type semiconductor region 17 in the field plate portion 16 is electrically connected to the source region 21 and the p-type body contact region 22 by the plug 24A to the plug 24C and wiring 25A. On the other hand, the high concentration n-type semiconductor region 19 in the field plate portion 16 is electrically connected to the drain region 20 by the plug 24D to the plug 24E and wiring 25B. As described above, LDMOSFET having a field plate structure in the present embodiment can be manufactured.

Second Method of Manufacturing Semiconductor Device

Figure 9:
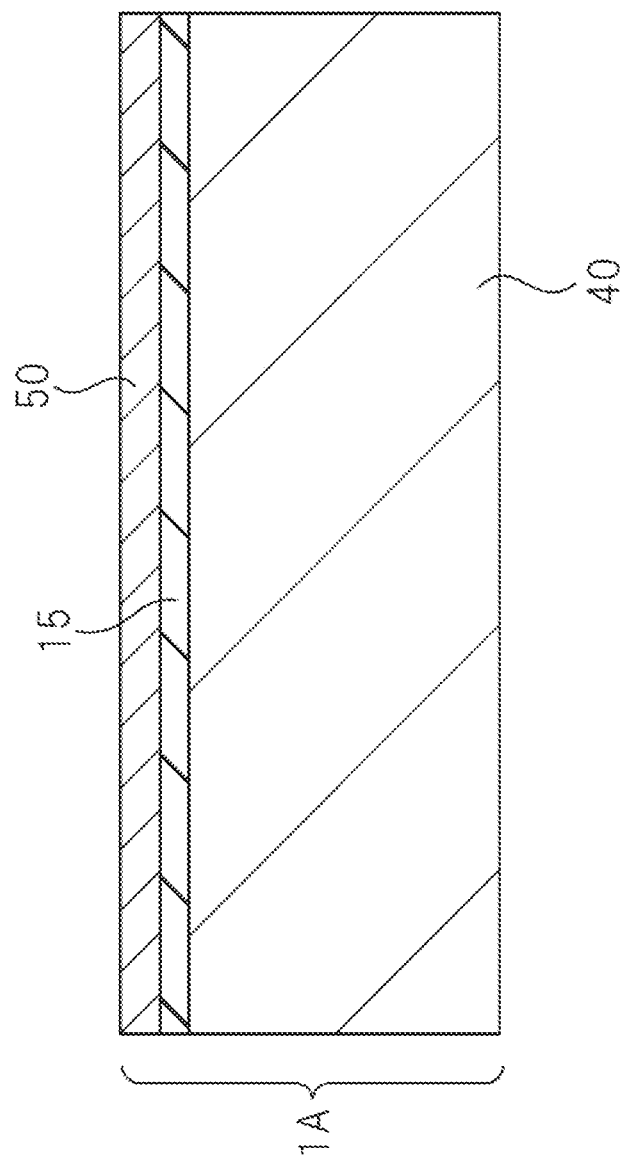
FIG. 9 is a cross-sectional view showing the manufacturing process of semiconductor device in one embodiment.

First, as shown in FIG. 9, an SOI substrate 1A having a support substrate 40, an insulating film 15 formed on the support substrate 40 and a single crystal silicon layer 50 formed on the insulating film 15 are prepared.

Figure 10:
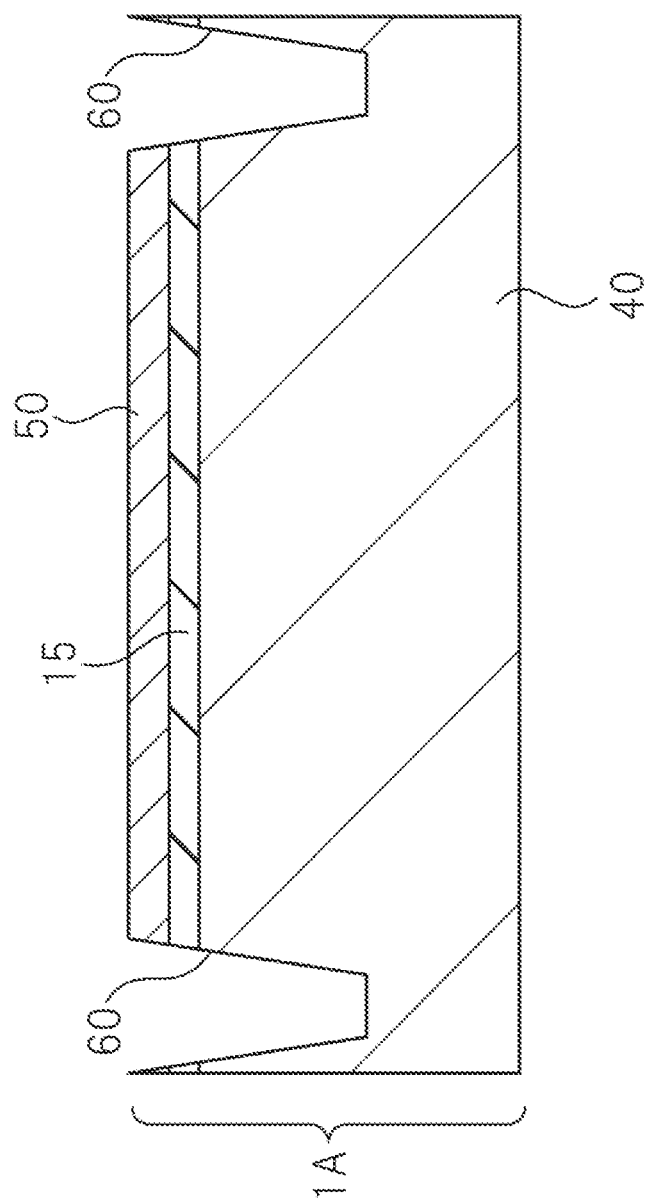
FIG. 10 is a cross-sectional view showing the manufacturing process of semiconductor device following FIG. 9.

Next, as shown in FIG. 10, the element isolation trench 60 is formed in the SOI substrate 1A by using a photolithography technique and an etching technique.

Figure 11:
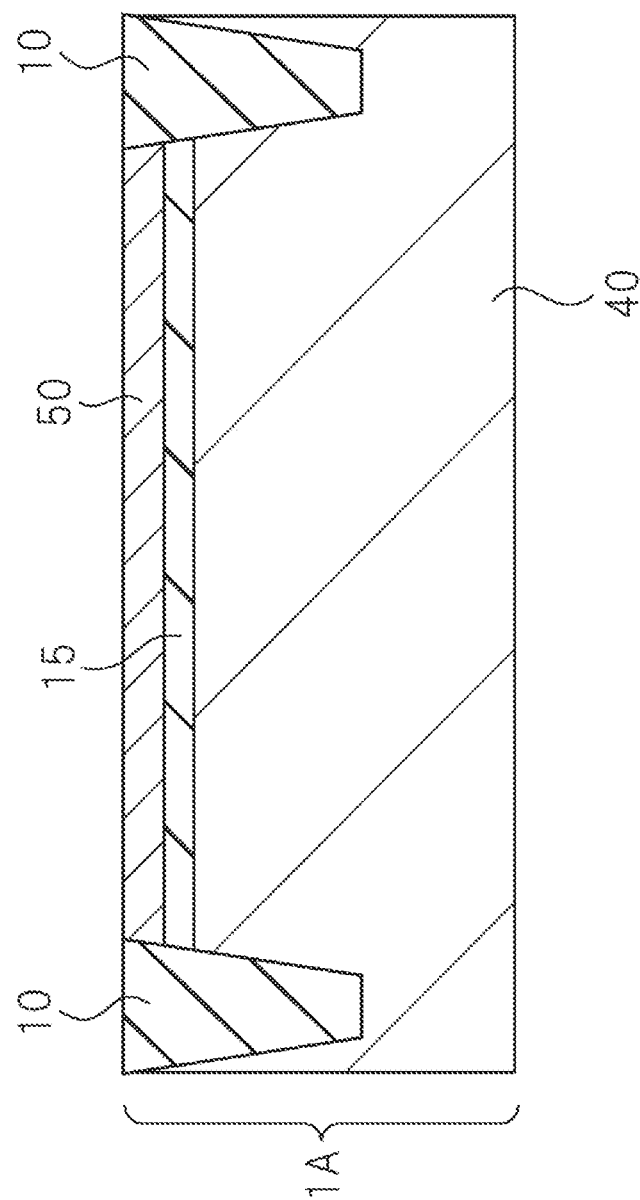
FIG. 11 is a cross-sectional view showing the manufacturing process of semiconductor device following FIG. 10.

Then, as shown in FIG. 11, by embedding an insulating film in the element isolation trench 60, an element isolation region 10 is formed in the SOI substrate 1A.

Figure 12:
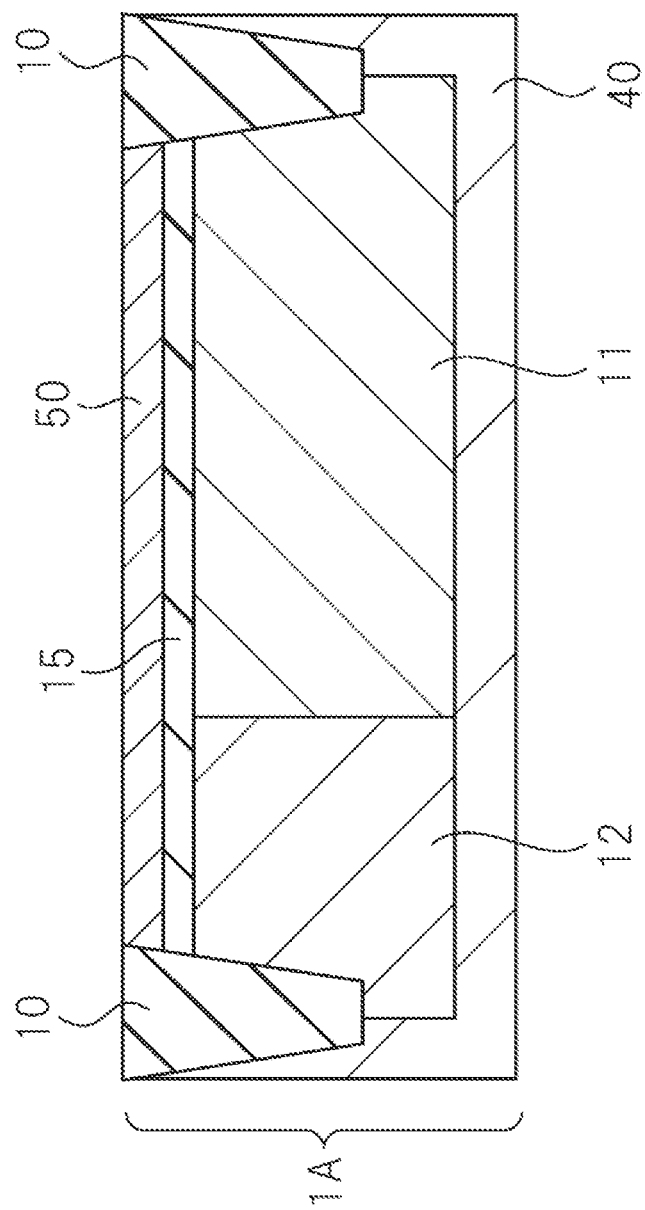
FIG. 12 is a cross-sectional view showing the manufacturing process of semiconductor device following FIG. 11.

Subsequently, as shown in FIG. 12, the drift layer 11 and the p-type body region 12 are formed in the SOI substrate layer 1A by using a photolithography technique and an ion implantation method. The drift layer 11 is formed by implanting phosphorus, which is an n-type impurity, into the SOI substrate 1A. On the other hand, the p-type body region 12 is formed by implanting boron, which is a p-type impurity (acceptor), into the SOI substrate 1A.

Figure 13:
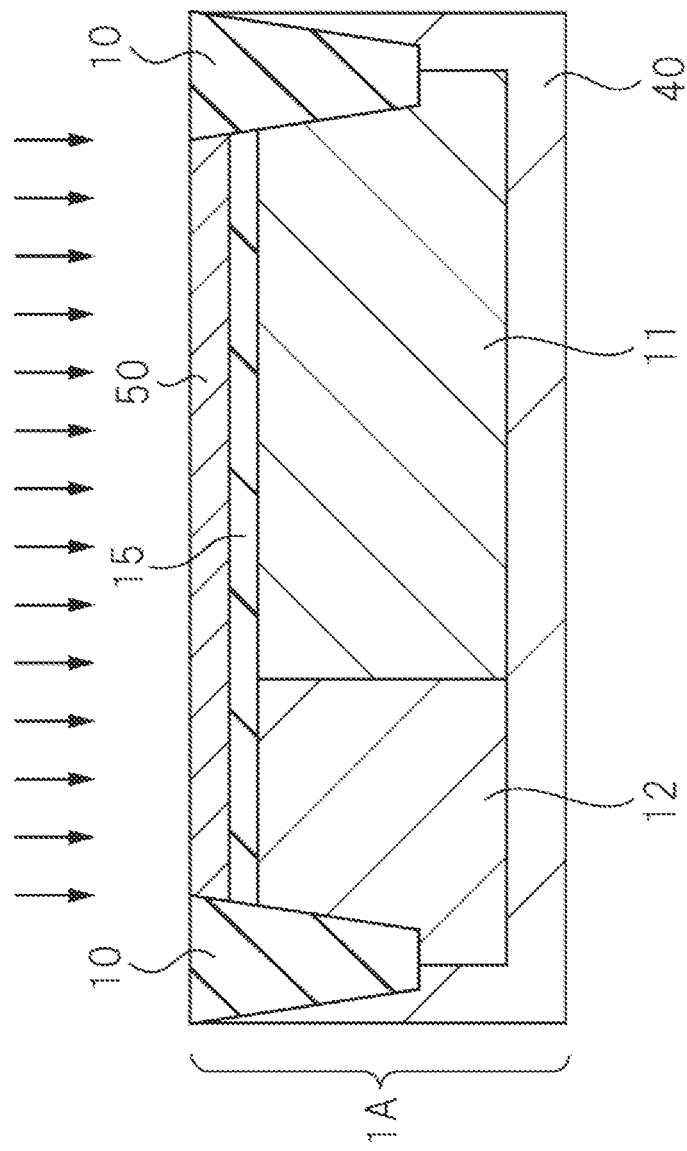
FIG. 13 is a cross-sectional view showing the manufacturing process of semiconductor device following FIG. 12.

Thereafter, as shown in FIG. 13, boron, which is a p-type impurity, is implanted into single crystal silicon layer 50 by using a photolithography technique and an ion implantation method.

Figure 14:
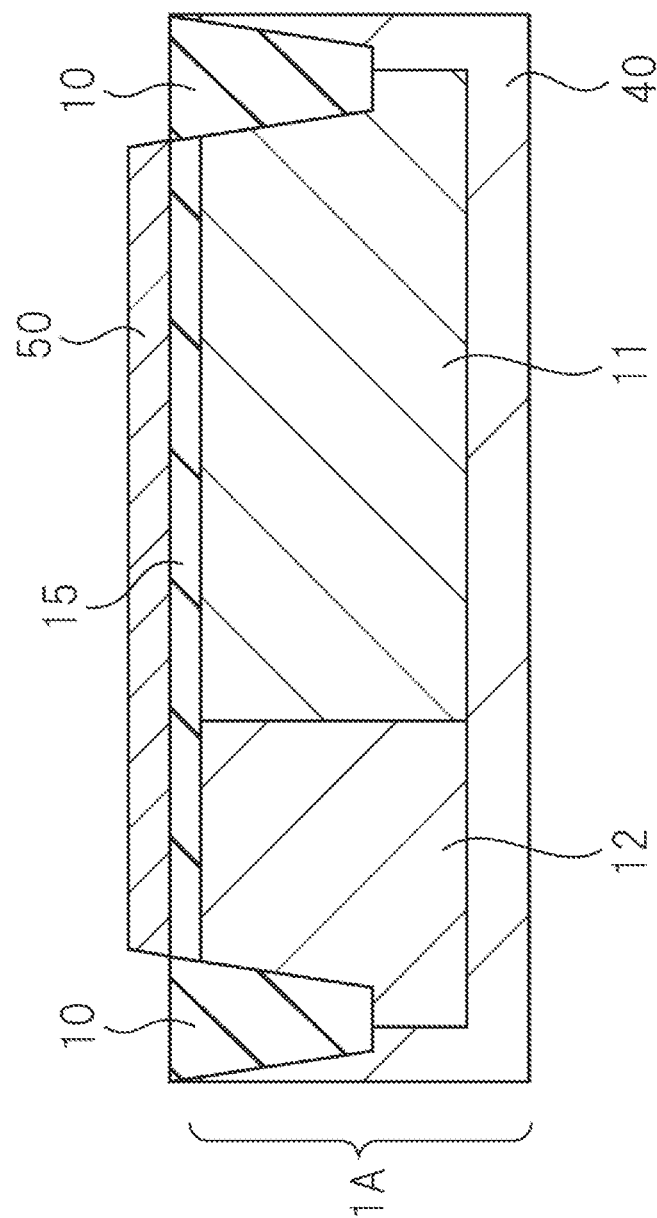
FIG. 14 is a cross-sectional view showing the manufacturing process of semiconductor device following FIG. 13.
Figure 15:
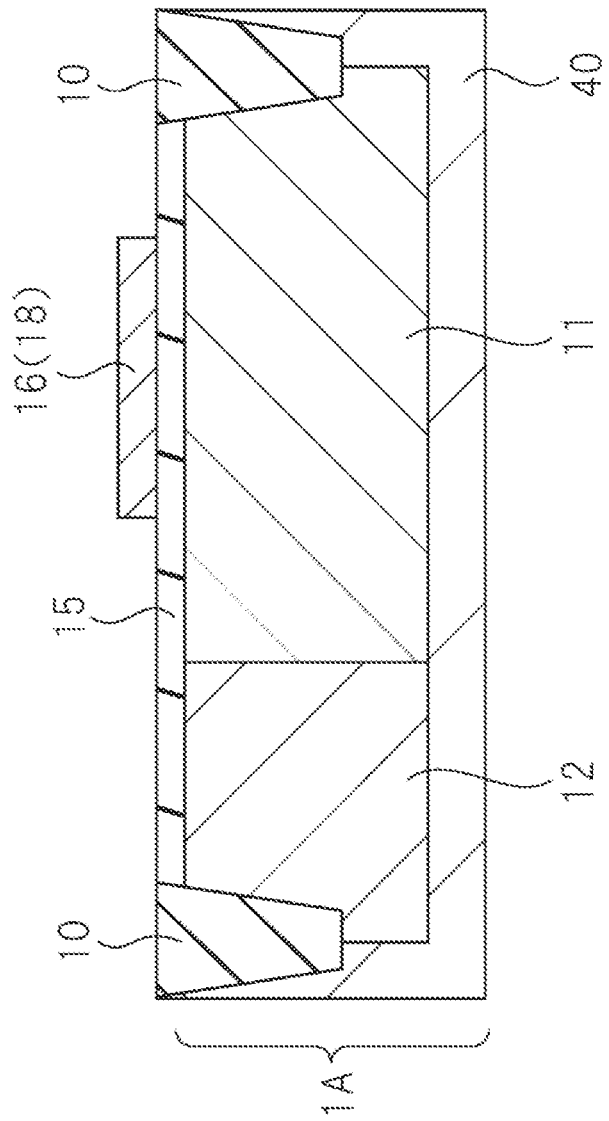
FIG. 15 is a cross-sectional view showing the manufacturing process of semiconductor device following FIG. 14.

The surface of the element isolation region 10 is then recessed by using photolithography and etching techniques, as shown in FIG. 14. Thereafter, single crystal silicon layer 50 is patterned by using photolithography and etching techniques, as shown in FIG. 15. Thus, the field plate portion 16 can be formed on the insulating film 15. At this stage, the field plate portion 16 is configured by a low concentration p-type semiconductor region 18.

Figure 16:
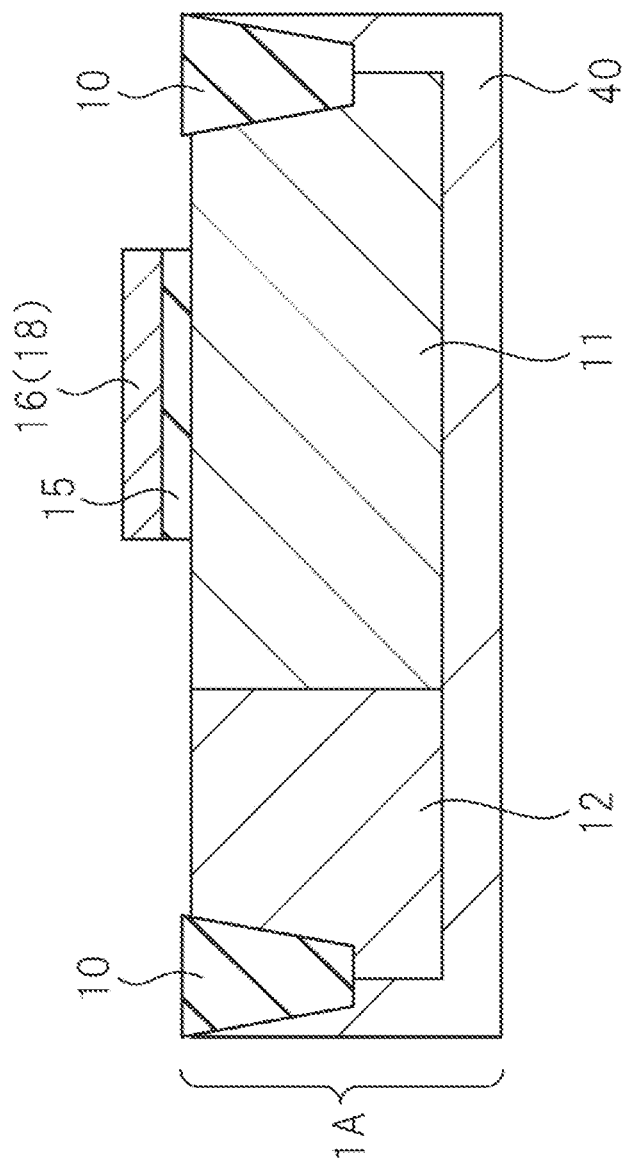
FIG. 16 is a cross-sectional view showing the manufacturing process of semiconductor device following FIG. 15.
Figure 17:
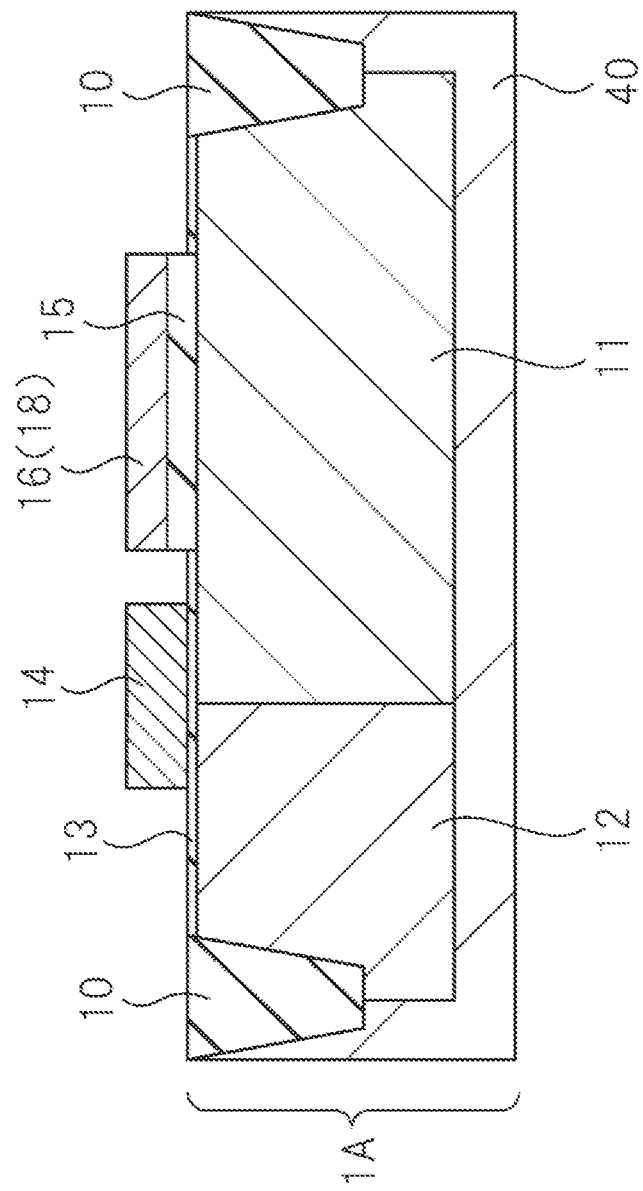
FIG. 17 is a cross-sectional view showing the manufacturing process of semiconductor device following FIG. 16.

Subsequently, as shown in FIG. 16, the insulating film 15 exposed from the field plate portion 16 is removed by using, for example, an etch-back technique. Then, as shown in FIG. 17, the gate dielectric film 13 is formed on the region from which the insulating film 15 has been removed by using, for example, a thermal oxidation method. Furthermore, for example, a polysilicon film is formed to cover the SOI substrate 1A by using the CVD method, and the polysilicon film is patterned by using photolithography and etching techniques. As a result, the gate electrode 14 can be formed on the gate dielectric film 13.

Figure 18:
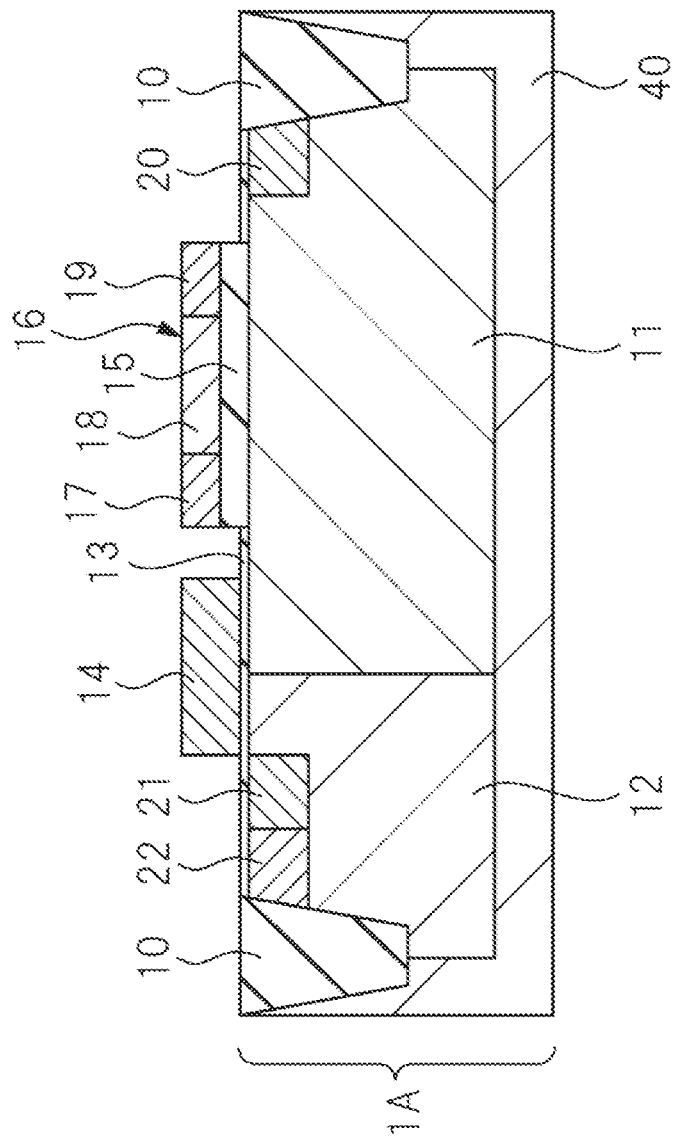
FIG. 18 is a cross-sectional view showing the manufacturing process of semiconductor device following FIG. 17.

Next, as shown in FIG. 18, a high concentration p-type semiconductor region 17 and a high concentration n-type semiconductor region 19 are formed in the field plate portion 16 by using a photolithography technique and an ion implantation method. The high concentration p-type semiconductor region 17 can be formed by implanting boron, which is a p-type impurity, into the field plate portion 16. On the other hand, the high concentration n-type semiconductor region 19 can be formed by implanting phosphorus, which is an n-type impurity, into the field plate portion 16. As a result, the field plate portion 16 is configured by the high concentration p-type semiconductor region 17, the low concentration p-type semiconductor region 18, and the high concentration n-type semiconductor region 19.

Thereafter, the drain region 20 is formed in the drift layer 11, and the source region 21 and the p-type body contact region 22 are formed in the p-type body region 12 by using a photolithography technique and an ion implantation method. The drain region 20 and the source region 21 can be formed by implanting phosphorus which is an n-type impurity. On the other hand, the p-type body contact region 22 can be formed by implanting boron which is a p-type impurity.

Figure 19:
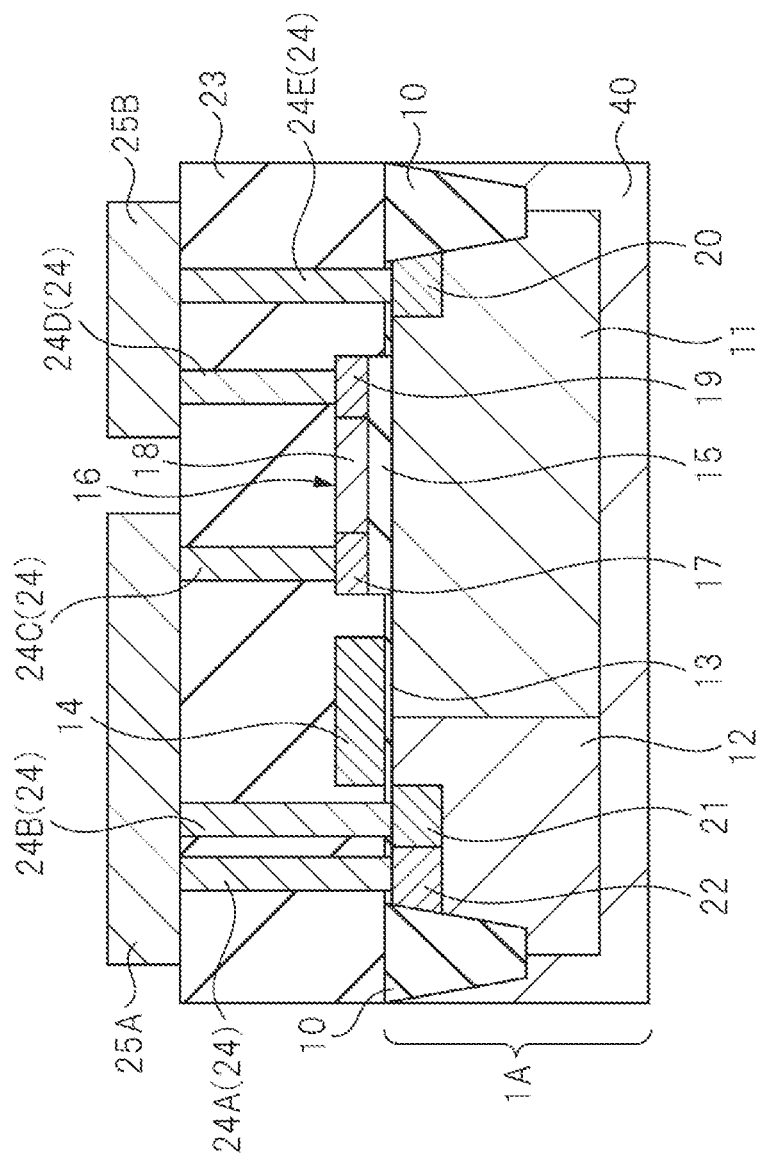
FIG. 19 is a cross-sectional view showing the manufacturing process of semiconductor device following FIG. 18.

After LDMOSFET is formed in this manner, a wiring step is performed. Specifically, as shown in FIG. 19, an interlayer insulating film 23 is formed so as to cover LDMOSFET. Then, by using a photolithography technique and etching technique, after forming a plurality of contact holes in the interlayer insulating film 23, a plurality of plugs 24 are formed by embedding a conductor film in each of the plurality of contact holes. Subsequently, wiring 25A and wiring 25B are formed on the interlayer insulating film 23 in which a plurality of plugs 24 are formed.

Here, as shown in FIG. 19, the high concentration p-type semiconductor region 17 in the field plate portion 16 is electrically connected to the source region 21 and the p-type body contact region 22 by the plug 24A to the plug 24C and the wiring 25A. On the other hand, the high concentration n-type semiconductor regions 19 in the field plate portion 16 is electrically connected to the drain region 20 by the plug 24D to the plug 24E and the wiring 25B. As described above, a LDMOSFET having a field plate structure in the present embodiment can be manufactured.

Further Contrivance for Improving the Breakdown Voltage

As a result of intensive studies in order to further improve the breakdown voltage of LDMOSFET, as shown below, the present inventors thought a plurality of contrivance points to prevent the formation of dense regions in the equipotential line distribution, it will be described these contrivance points.

Figure 20:
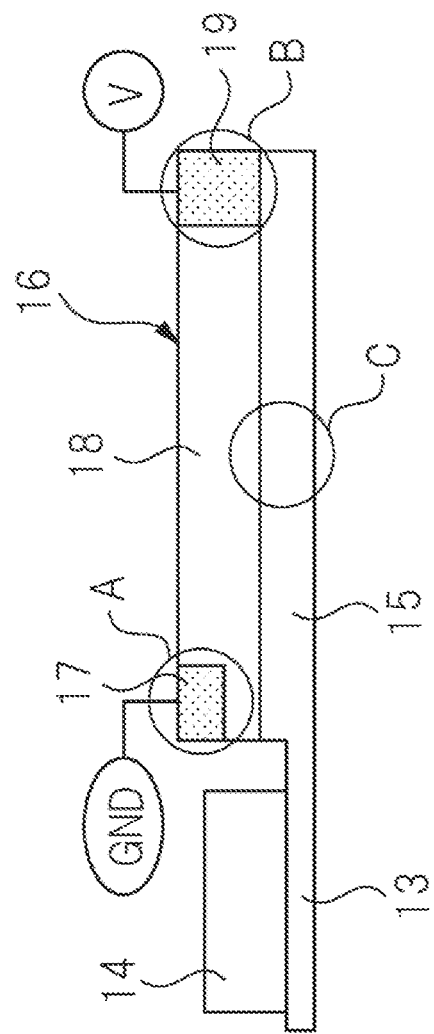
FIG. 20 is a diagram schematically showing a structural part of LDMOSFET devised to improve the breakdown voltage, and specifically, a diagram schematically showing a structural part devised to improve the breakdown voltage in a field plate portion.

FIG. 20 is a diagram schematically showing a structural part of the LDMOSFET to which a contrivance for improving the breakdown voltage is applied, and specifically, a schematic diagram showing a structural part to which a contrivance for improving the breakdown voltage is applied in the field plate portion 16.

In FIG. 20, the contrivance point for the high concentration p-type semiconductor region 17 surrounded by the "circle A" is the "first contrivance point", and the contrivance point for the high concentration n-type semiconductor region 19 surrounded by the "circle B" is the "second contrivance point". Further, a contrivance point regarding the insulating film 15 surrounded by the "circle C" is the "third contrivance point". Hereinafter, each of the above-mentioned three contrivance points will be described.

First Contrivance Point

In FIG. 20, the first contrivance point is that the low concentration p-type semiconductor region 18 in the field plate portion 16 is in contact with the insulating film 15, while a portion of the low concentration p-type semiconductor region 18 is interposed between the bottom portion of the high concentration p-type semiconductor region 17 and the insulating film 15. In other words, the first contrivance point is that the thickness of the high concentration p-type semiconductor region 17 is smaller than the thickness of the field plate portion 16, and the high concentration p-type semiconductor region 17 is not in contact with the insulating film 15.

Thus, at the source end side (left side) of the field plate portion 16, a dense region is less likely to be formed in the equipotential line distribution, it is possible to improve the breakdown voltage of LDMOSFET.

Hereinafter, the reason for this will be described below.

Figure 21A:
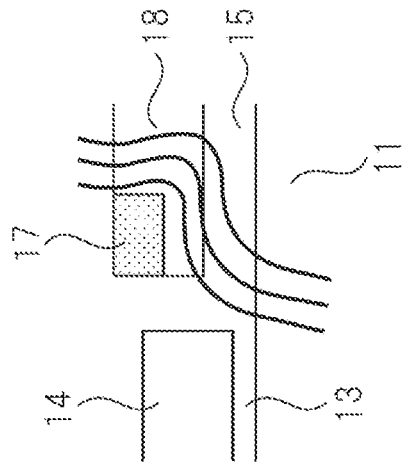
FIG. 21A is a schematic diagram showing that the equipotential line distribution is dense in a configuration that does not employ the first contrivance point.
Figure 21B:
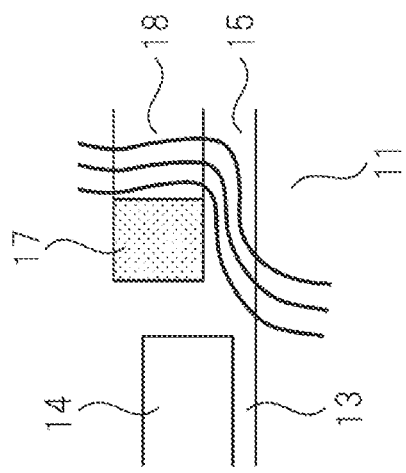
FIG. 21B is a schematic diagram showing that the equipotential line distribution is hard to be dense by a configuration employing the first contrivance point.

FIG. 21 is, according to the first contrivance point, a diagram showing that a dense region is less likely to be formed in the equipotential line distribution. In particular, FIG. 21A is a schematic diagram showing that the equipotential line distribution is dense in a configuration that does not adopt the first contrivance point, FIG. 21B is a schematic diagram showing that the equipotential line distribution is less dense by a configuration employing the first contrivance point.

Specifically, in FIG. 21A, the high concentration p-type semiconductor region 17 reaches the insulating film 15. In this case, considering that the impurity concentration of the high concentration p-type semiconductor region 17 is high and the equipotential lines do not enter the high concentration p-type semiconductor region 17, the equipotential line distribution shown by the thick line is dense. That is, in FIG. 21A, as a consequence of the equipotential lines distance is narrowed, electric field concentration occurs, the breakdown voltage of LDMOSFET is likely to decrease.

On the other hand, in FIG. 21B, the high concentration p-type semiconductor region 17 does not reach the insulating film 15. In this case, considering that the impurity concentration of the high concentration p-type semiconductor region 17 is high and the equipotential lines do not enter the high concentration p-type semiconductor region 17, the equipotential line distribution shown by the thick line is less dense as compared with FIG. 21A. That is, in FIG. 21B, as a consequence of the equipotential line distance is widened, the electric field concentration is suppressed, it is possible to improve the breakdown voltage of LDMOSFET.

Thus, as shown in FIG. 21A and FIG. 21B, according to the first contrivance point, as a consequence of the dense regions in the equipotential line distribution is less likely to be formed, it can be seen that it is possible to improve the breakdown voltage of LDMOSFET.

Second Contrivance Point

In FIG. 20, the second contrivance point is that the low concentration p-type semiconductor region 18 in the field plate portion 16 is in contact with the insulating film 15, and the bottom portion of the high concentration n-type semiconductor region 19 is in contact with the insulating film 15. In other words, the second contrivance point is that the thickness of the high concentration n-type semiconductor region 19 is equal to the thickness of the field plate portion 16, and the high concentration n-type semiconductor region 19 reaches the insulating film 15.

Thus, at the drain end side (right side) of the field plate portion 16, a dense region is less likely to be formed in the equipotential line distribution, it is possible to improve the breakdown voltage of LDMOSFET.

Hereinafter, the reason for this will be described below.

For example, considering that the region to be dense in the equipotential line distribution at the source end side is less likely to be formed by the first contrivance point described above, even in the drain end side, by adopting the same configuration as the first contrivance point, the region to be dense in the equipotential line distribution at the drain end side of the field plate portion 16 is less likely to be formed, it can be considered that it is possible to improve the breakdown voltage of LDMOSFET.

However, at the drain end side of the field plate portion 16, due to the presence of the drain region 20 configured by a high concentration n-type semiconductor region under the high concentration n-type semiconductor region 19, rather than the first contrivance point, dense region is less likely to be formed in the equipotential line distribution at the drain end side of the field plate portion 16 by adopting the second contrivance point described above, it is possible to improve the breakdown voltage of LDMOSFET.

The reason for this will be described below.

FIG. 22 is, according to the second contrivance point, a diagram showing that the region to be dense in the equipotential line distribution is less likely to be formed. In particular, FIG. 22A is a schematic diagram showing that the equipotential line distribution is dense in a configuration that does not adopt the second contrivance point, FIG. 22B is a schematic diagram showing that the equipotential line distribution is less dense by a configuration employing the second contrivance point.

Specifically, in FIG. 22A, the high concentration n-type semiconductor region 19 does not reach the insulating film 15. In this case, considering that the impurity concentration of the high concentration n-type semiconductor region 19 and the impurity concentration of the drain region 20 are high and the equipotential lines do not enter the high concentration n-type semiconductor region 19 and the drain region 20, the equipotential line distribution is flexed. Thus, the equipotential lines enter between the high concentration n-type semiconductor region 19 and the drain region 20, a region to be dense in the equipotential line distribution is formed. Consequently, electric field concentration occurs, the breakdown voltage of LDMOSFET is likely to decrease.

On the other hand, in FIG. 22B, the high concentration n-type semiconductor region 19 reaches the insulating film 15. In this case, since the equipotential lines do not enter between the high concentration n-type semiconductor region 19 and the drain region 20, the equipotential line distribution is less dense than in FIG. 22A. That is, in FIG. 22B, as a result of not entering the equipotential lines between the high concentration n-type semiconductor region 19 and the drain region 20, since the region to be dense in the equipotential line distribution is not formed, the electric field concentration is suppressed, it is possible to improve the breakdown voltage of LDMOSFET.

Thus, as shown in FIG. 22A and FIG. 22B, according to the second contrivance point, as a consequence of the dense regions in the equipotential line distribution is less likely to be formed, it can be seen that it is possible to improve the breakdown voltage of LDMOSFET.

Third Contrivance Point

Figure 23:
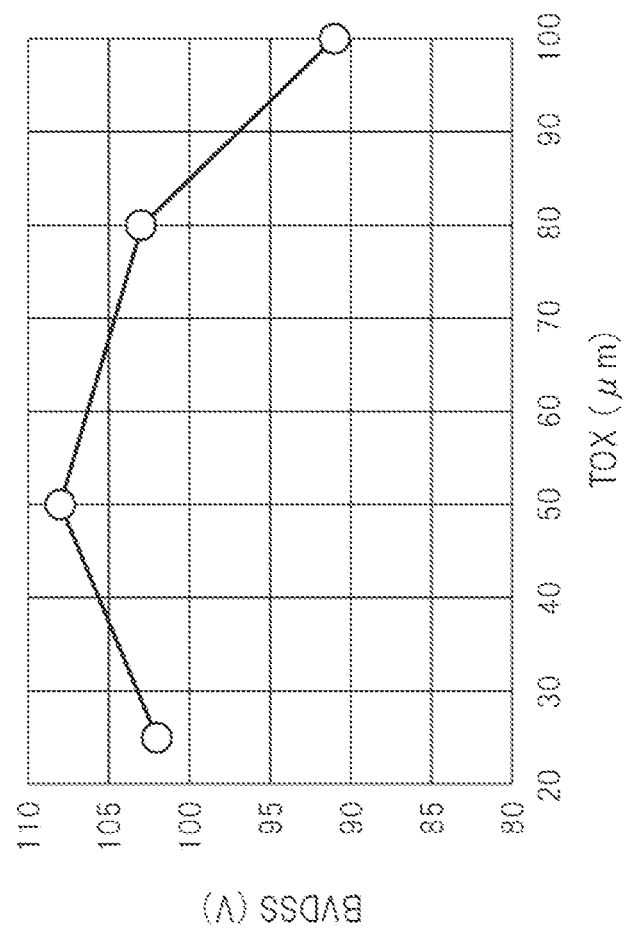
FIG. 23 is a graph showing the relationship between the film thickness of the insulating film and the breakdown voltage of LDMOSFET.

FIG. 23 is a graph showing the relationship between the film thickness of the insulating film 15 (TOX) and the breakdown voltage of LDMOSFET (BVDSS). The film thickness of the gate dielectric film 13 is, for example, 25 nm, and in this instance, as shown in FIG. 23, when the film thickness of the insulating film 15 is about 50 nm, which is thicker than the gate dielectric film, it is found that it is optimal from the viewpoint of improving the breakdown voltage. For example, since the gate dielectric film 13 is desirably thinner from the viewpoint of reducing the channel resistance, it is understood that satisfying the relation which the film thickness of the gate dielectric film 13 is smaller than the film thickness of the insulating film 15 is beneficial for achieving both the improvement of the breakdown voltage and the reduction of the on-resistance. Specifically, it can be understood that setting the film thickness of the insulating film 15 to about twice the film thickness of the gate dielectric film 13 is beneficial for achieving both the improvement in breakdown voltage and the reduction in on-resistance which are in trade-off relation.

Here, from the graph shown in FIG. 23, the reason why the breakdown voltage is lowered even if the film thickness of the insulating film 15 is too thin while the breakdown voltage is lowered even if the film thickness of the insulating film 15 is too thick, will be described.

Figure 24:
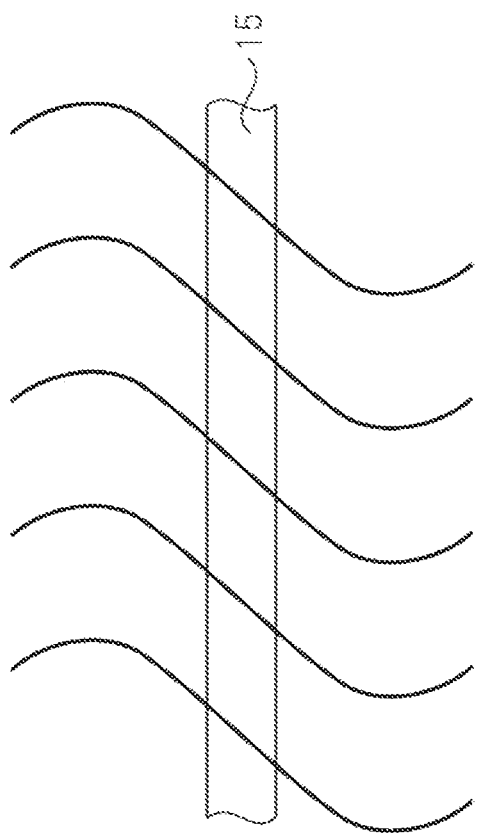
FIG. 24 is a diagram schematically showing an equipotential line distribution in the insulating film.

FIG. 24 is a diagram schematically showing the equipotential line distribution in the insulating film 15. As shown in FIG. 24, in the insulating film 15, the equipotential lines are inclined straight lines. On this premise, the reason why the breakdown voltage is lowered even if the film thickness of the insulating film 15 is too thin while the breakdown voltage is lowered even if the film thickness of the insulating film 15 is too thick, will be described with reference to FIGS. 25 and 26.

Figure 25:
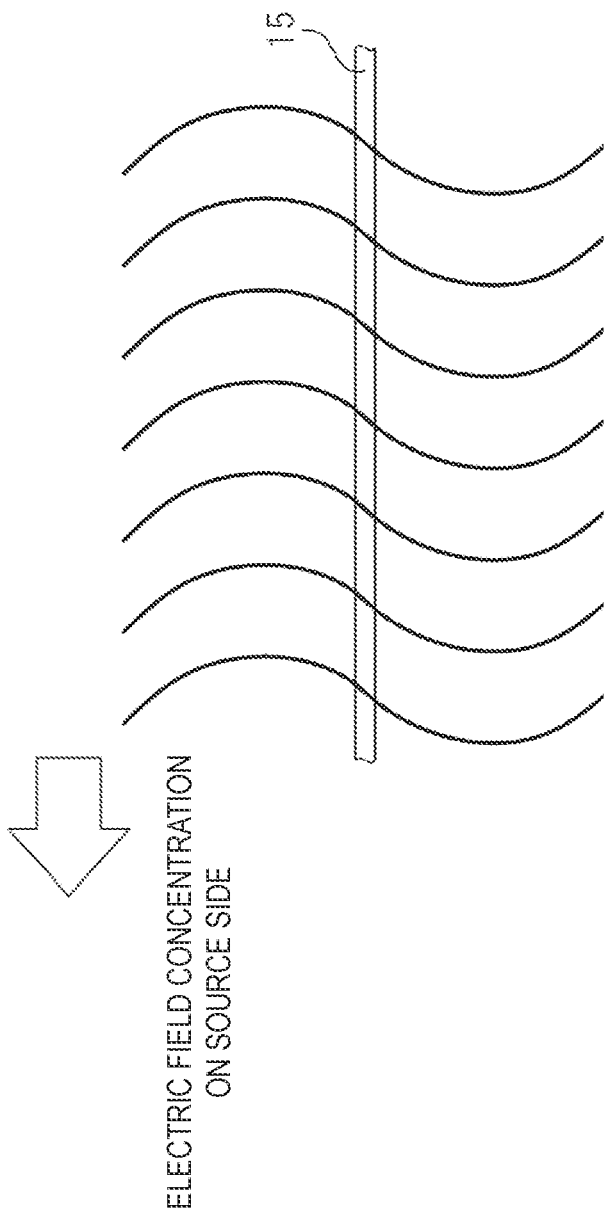
FIG. 25 is a diagram schematically showing an equipotential line distribution when the insulating film is thin.

FIG. 25 is a diagram schematically showing an equipotential line distribution when the insulating film 15 is thin. From FIG. 25, it is understood that when the film thickness of the insulating film 15 become thin, the equipotential line distribution shifts to the source side, and as a result, the equipotential lines become dense on the source side, and electric field concentration easily occurs. That is, if the film thickness of the insulating film 15 is too thin, electric field concentration tends to occur on the source side, and deterioration in the breakdown voltage caused by the electric field concentration becomes apparent.

On the other hand, FIG. 26 is a diagram schematically showing the equipotential line distribution in the case where the insulating film 15 is thick. From FIG. 26, when the film thickness of the insulating film 15 is thick, the result of the equipotential line distribution is shifted to the drain side, the equipotential line becomes dense in the drain side, it can be seen that the electric field concentration is likely to occur. That is, if the film thickness of the insulating film 15 is too thick, the electric field concentration tends to occur in the drain side, and deterioration in the breakdown voltage due to the electric field concentration becomes apparent.

From the above, it is understood that even if the film thickness of the insulating film 15 is too thin, the breakdown voltage is lowered, and even if the film thickness of the insulating film 15 is too thick, the breakdown voltage is lowered. Thus, the characteristics of the graph shown in FIG. 23 can be understood. Therefore, from the viewpoint of improving the breakdown voltage, it is preferable that the film thickness of the insulating film 15 is not too thin and not too thick. As described above, the film thickness of the insulating film 15 is desirably about twice the film thickness of the gate dielectric film 13.

The invention made by the present inventor has been described above in detail based on the embodiment, but the present invention is not limited to the embodiment described above, and it is needless to say that various modifications can be made without departing from the gist thereof.

The embodiment includes the following embodiments.

APPENDIX 1

A method of manufacturing a semiconductor device includes the steps of: (a) forming a first insulating film on a first region of a semiconductor substrate; (b) forming a second insulating film on a second region of the semiconductor substrate; (c) forming a gate electrode on the first insulating film; (d) forming a field plate portion on the second insulating film; (e) forming a first semiconductor region of a second conductivity type in the field plate portion; (f) forming a second semiconductor region of a first conductivity type in the field plate portion; (g) forming a source region of the first conductivity type in the semiconductor substrate; (h) forming a drain region of the first conductivity type in the semiconductor substrate; (i) electrically connecting the source region with the first semiconductor region; and (j) electrically connecting the drain region with the second semiconductor region.

APPENDIX 2

In the method according to the APPENDIX 1, the (d) includes (d1) forming an amorphous semiconductor film at least on the second insulating film and (d2) patterning the amorphous semiconductor film.

APPENDIX 3

A method of manufacturing a semiconductor device includes the steps of: (a) preparing an SOI substrate having a support substrate, a second insulating film formed on the support substrate and a semiconductor layer formed on the second insulating film; (b) processing the semiconductor layer to form a field plate portion on the second insulating film formed on a second region of the SOI substrate; (c) removing the second insulating film formed on a first region of the SOI substrate; (d) forming a first insulating film on the first region; (e) forming a gate electrode on the first insulating film; (f) forming a first semiconductor region of a second conductivity type in the field plate portion; (g) forming a second semiconductor region of a first conductivity type in the field plate portion; (h) forming a source region of the first conductivity type in the SOI substrate; (i) forming a drain region of the first conductivity type in the SOI substrate; (j) electrically connecting the source region with the first semiconductor region; and (k) electrically connecting the drain region with the second semiconductor region.

APPENDIX 4

In the method according to the APPENDIX 3, the semiconductor layer is a single crystal semiconductor layer.

What is claimed is:
1. A semiconductor device, comprising:
a semiconductor substrate;
a first insulating film formed on a first region of the semiconductor substrate;
a second insulating film formed on a second region of the semiconductor substrate;
a gate electrode formed on the first insulating film;
a field plate portion formed on the second insulating film;
a source region of a first conductivity type, the source region being formed in the semiconductor substrate; and
a drain region of the first conductivity type, the drain region being formed in the semiconductor substrate,
wherein the field plate portion includes:
a first semiconductor region of a second conductivity type different from the first conductivity type; and a second semiconductor region of the first conductivity type, wherein the first semiconductor region is electrically connected to the source region, wherein the second semiconductor region is electrically connected to the drain region, wherein the first semiconductor region includes:
- a first high concentration semiconductor region; and
- a first low concentration semiconductor region having a lower impurity concentration than the first high concentration semiconductor region, wherein, in plan view, the first low concentration semiconductor region is arranged so as to be sandwiched between the first high concentration semiconductor region and the second semiconductor region, wherein the first high concentration semiconductor region is electrically connected to the source region, wherein the first low concentration semiconductor region is in contact with the second insulating film, and wherein a part of the first low concentration semiconductor region is interposed between a bottom of the first high concentration semiconductor region and the second insulating film.

2. The semiconductor device according to claim 1,
wherein the field plate portion includes pn junction formed by the first semiconductor region and the second semiconductor region.

3. The semiconductor device according to claim 1,
wherein the gate electrode is configured by a semiconductor film of the first conductivity type, and
wherein an impurity concentration of the field plate portion is lower than an impurity concentration of the gate electrode.

4. The semiconductor device according to claim 1,
wherein a film thickness of the second insulating film is thicker than a film thickness of the first insulating film.

5. The semiconductor device according to claim 4,
wherein the film thickness of the second insulating film is twice as much as the film thickness of the first insulating film.

6. The semiconductor device according to claim 1,
wherein a film thickness of the second insulating film is equal to a film thickness of the first insulating film.

7. The semiconductor device according to claim 1, comprising:
- a first plug electrically connected to the first high concentration semiconductor region;
- a second plug electrically connected to the second semiconductor region;
- a first wiring electrically connected to the first plug; and
- a second wiring electrically connected to the second plug, wherein, in plan view, the first wiring has a first overhanging part overhanged from the first plug to the second wiring side, and wherein, in plan view, the second wiring has a second overhanging part overhanged from the second plug to the first wiring side.

8. The semiconductor device according to claim 7,
wherein a first width of the first overhanging part is 0.4 µm or more and 1.0 µm or less, and
wherein a second width of the second overhanging part is 0.4 µm or more and 1.0 µm or less.

9. The semiconductor device according to claim 1,
wherein the second semiconductor region is in contact with the second insulating film.

10. The semiconductor device according to claim 1,
wherein the field plate portion is configured by an amorphous semiconductor film.

11. The semiconductor device according to claim 1,
wherein the field plate portion is configured by a single crystal semiconductor film.

12. The semiconductor device according to claim 1,
wherein the field plate portion includes a depleted region when a first potential is supplied to the source region and a second potential higher than the first potential is supplied to the drain region.

13. The semiconductor device according to claim 1,
wherein the first low concentration semiconductor region is depleted when a first potential is supplied to the source region and a second potential higher than the first potential is supplied to the drain region.

* * * * *